US012308860B2

(12) United States Patent
Mazzaro et al.

(10) Patent No.: US 12,308,860 B2
(45) Date of Patent: May 20, 2025

(54) APPARATUS FOR MITIGATING NONLINEARITY-INDUCED SPURS AND NOISE IN A FRACTIONAL-N FREQUENCY SYNTHESIZER

(71) Applicant: University College Dublin, Dublin (IE)

(72) Inventors: Valerio Mazzaro, Pavia (IT); Michael Peter Kennedy, Dublin (IE)

(73) Assignee: University College Dublin, Dublin (IE)

( * ) Notice: Subject to any disclaimer, the term of this patent is extended or adjusted under 35 U.S.C. 154(b) by 45 days.

(21) Appl. No.: 18/085,066

(22) Filed: Dec. 20, 2022

(65) Prior Publication Data

US 2023/0198547 A1    Jun. 22, 2023

Related U.S. Application Data

(60) Provisional application No. 63/292,350, filed on Dec. 21, 2021.

(51) Int. Cl.
*H03M 7/32* (2006.01)
*H03M 7/36* (2006.01)

(52) U.S. Cl.
CPC ....... *H03M 7/3008* (2013.01); *H03M 7/3026* (2013.01)

(58) Field of Classification Search
CPC . H03M 7/3008; H03M 7/3026; H03M 7/3022
See application file for complete search history.

(56) References Cited

U.S. PATENT DOCUMENTS

| 6,252,464 | B1 * | 6/2001 | Richards | ............ H03L 7/20 |
| | | | | 331/25 |
| 6,683,960 | B1 * | 1/2004 | Fujii | ............ G10K 11/17854 |
| | | | | 381/71.8 |

(Continued)

*Primary Examiner* — Lam T Mai
(74) *Attorney, Agent, or Firm* — LOZA & LOZA, LLP; Anthony Smyth

(57) ABSTRACT

A digital delta-sigma modulator (DDSM) is disclosed with an input signal x[n], an output signal y[n], a quantization error signal e[n] and a dither signal d[n], having an equation described in the z-domain by $$Y(z)=STF(z)X(z)+DTF(z)D(z)-NTF(z)E(z),$$

wherein $Y(z)$, $X(z)$, $D(z)$ and $E(z)$ are z-transforms of the output signal, the input signal, the dither signal, and the quantization error signal, and wherein $STF(z)$, $DTF(z)$ and $NTF(z)$ correspond to a transfer function of the input signal, a transfer function of the dither signal, and a transfer function of the quantization error signal, and wherein the transfer function of the quantization error signal is of the form:

$$NTF(z) = Az^{-Q}(1-z^{-1})\left(1 + \sum_{i=1}^{K} c_i z^{-i}\right),$$

A, Q and K are constants, coefficients $c_i$ are real valued and $c_K \neq 0$ and wherein at least one of the zeroes $z_j$ of $$\left(1 + \sum_{i=1}^{K} c_i z^{-i}\right)$$

satisfies $z_j \neq +1$ for $j=1, 2, \ldots, K$.

13 Claims, 16 Drawing Sheets

(56) References Cited

U.S. PATENT DOCUMENTS

| | | | | |
|---|---|---|---|---|
| 7,460,046 B2* | 12/2008 | Di Giandomenico | ............ | H03M 3/416 |
| | | | | 341/143 |
| 9,985,646 B1* | 5/2018 | Mallett | ................ | H03M 3/494 |
| 10,033,400 B1* | 7/2018 | Mallett | ................ | H03M 1/1071 |
| 11,424,748 B1* | 8/2022 | Geetla | ................ | H03L 7/0992 |
| 11,658,666 B1* | 5/2023 | Moehlmann | ............ | H03L 7/083 |
| | | | | 327/158 |
| 2004/0208249 A1* | 10/2004 | Risbo | ................ | H03M 3/388 |
| | | | | 375/243 |
| 2009/0066549 A1* | 3/2009 | Thomsen | ............ | H03M 3/484 |
| | | | | 341/143 |
| 2010/0245136 A1* | 9/2010 | Azadet | ................ | H03M 7/3008 |
| | | | | 341/118 |
| 2012/0086590 A1* | 4/2012 | Satarzadeh | ........... | H03M 3/464 |
| | | | | 341/120 |
| 2012/0146819 A1* | 6/2012 | Silva | ................ | G01R 19/02 |
| | | | | 341/110 |
| 2013/0300467 A1* | 11/2013 | Eldredge | ............ | H03L 7/08 |
| | | | | 327/156 |
| 2018/0109231 A1* | 4/2018 | Kinyua | ................ | H03F 3/183 |
| 2019/0068207 A1* | 2/2019 | Mo | ................ | H03M 7/3022 |
| 2019/0089368 A1* | 3/2019 | Mo | ................ | H03M 3/394 |
| 2020/0042057 A1* | 2/2020 | Huang | ................ | G06F 1/04 |
| 2021/0175912 A1* | 6/2021 | Deb | ................ | H04B 1/04 |
| 2021/0399734 A1* | 12/2021 | Mai | ................ | H03M 3/438 |
| 2023/0198547 A1* | 6/2023 | Mazzaro | ............ | H03M 7/3022 |
| | | | | 341/50 |
| 2023/0327681 A1* | 10/2023 | Mazzaro | ............ | H03M 3/354 |
| | | | | 341/77 |

* cited by examiner

APPARATUS FOR MITIGATING NONLINEARITY-INDUCED SPURS AND NOISE IN A FRACTIONAL-N FREQUENCY SYNTHESIZER

FIELD OF THE DISCLOSURE

This disclosure relates to fractional-N frequency synthesizers. More particularly, this disclosure relates to mitigating nonlinearity-induced spurs and noise in such synthesizers.

DESCRIPTION OF RELATED ART

Fractional-N frequency synthesizers are widely used to generate programmable carrier frequencies. FIG. 1 shows a block diagram of one conventional fractional-N frequency synthesizer. A phase frequency detector (PFD) receives a reference frequency $f_{PD}$. The output signal from the phase frequency detector is passed through a charge pump (CP) and onto a loop filter. The output of the loop filter is then fed to a voltage controlled oscillator (VCO). The output frequency of the voltage controlled oscillator, $f_{VCO}$, is fed to a multimodulus divider, which counts an integer number of cycles of the output frequency and generates the divided frequency $f_{DIV}$, as an input to the phase frequency detector, thus forming the synthesizer's phase-locked loop. A divider controller provides as an output the control signal y[n], to which a constant $N_0$ is added. This sum is applied to the input of the multimodulus divider to control the instantaneous divide ratio. The output frequency $f_{VCO}$ is related to the reference frequency $f_{PD}$ by an integer $N_0$ plus a rational fraction (x/M), where M is called the modulus and x is the primary input signal to the divider controller. The sum of $N_0$ and the fraction x/M is denoted by $N_{div}$. A second input signal known as a dither signal d[n] is often applied to the divider controller to randomize the quantization noise that it produces.

One divider controller that is commonly used in a fractional-N frequency synthesizer is a Digital Delta-Sigma Modulator (DDSM).

FIG. 2(a) shows a block diagram of a single-quantizer DDSM. The linearized model is given in FIG. 2(b), where the error introduced by the quantizer is denoted by -e[n]. The governing equation of the DDSM in the z domain is $$Y(z)=STF(z)X(z)+DTF(z)D(z)-NTF(z)E(z),$$

where Y(z), X(z), D(z), and E(z) are the z-transforms of the output, primary input, dither signal and quantization error signals y[n], x[n], d[n] and e[n], respectively. Moreover, STF(z), DTF(z) and NTF(z) are the transfer functions from the primary input, dither input and quantization error to the output. According to the block diagram of FIG. 2, these functions are equal to $$STF(z) = \frac{F(z)}{1+F(z)G(z)},$$

$$DTF(z) = \frac{V(z)F(z)}{1+F(z)G(z)},$$

$$NTF(z) = \frac{1}{1+F(z)G(z)}.$$

The single-quantizer DDSM architecture requires a multibit quantizer and can suffer from stability problems due to delays in the transfer functions F(z) and G(z) in FIG. 2.

An alternative implementation of the same governing equation that requires simpler quantizers and has a feedforward structure is the MultistAge noise SHaping (MASH) digital delta-sigma modulator. FIG. 3 shows a block diagram of a multi-quantizer MASH DDSM that comprises a cascade of L number error feedback modulator (EFM) stages (denoted $EFM_j$, j=1, 2, . . . , L in FIG. 3) and an error cancellation network. Each EFM stage has an input $x_j$, a first output $y_j$ and a second output $e_j$, which is called the error, as shown in FIG. 4(a). The first output $y_j$ of each error feedback modulator stage in FIG. 3 is combined in the error cancellation network. In the case of all but the L-th stage, the second output $e_j$ is passed to the input of the next error feedback modulator stage in the cascade.

For the sake of completeness, FIG. 4(b) shows an implementation of an EFM. The governing equation in the z domain is $$Y(z)=Az^{-Q}X(z)-Az^{-Q}(1-H(z))E(z),$$

where A and Q are constants. According to the equation above, the signal and noise transfer functions are equal to $$STF(z)=Az^{-Q},$$

$$NTF(z)=Az^{-Q}(1-H(z)).$$

FIG. 5 shows a block diagram of a multi-level multi-quantizer nested cascaded MASH DDSM that comprises T levels of L cascaded error feedback modulator stages (denoted $EFM_{i,j}$, i=1, 2, . . . , T and j=1, 2, . . . , L in FIG. 5) and an error cancellation network. The sum of x[n] and the filtered dither, denoted $\hat{x}[n]$, is split into components $\hat{x}_i[n]$, with i=1, 2, . . . , T, wherein $$\hat{x}_i[n] = \begin{cases} \left\lfloor \frac{\hat{x}[n]}{\prod_{k=i+1}^{T} M_k} \right\rfloor - M_i \left\lfloor \frac{\hat{x}[n]}{\prod_{k=i}^{T} M_k} \right\rfloor & \text{if } \hat{x}[n] \geq 0 \\ \left\lceil \frac{\hat{x}[n]}{\prod_{k=i+1}^{T} M_k} \right\rceil - M_i \left\lceil \frac{\hat{x}[n]}{\prod_{k=i}^{T} M_k} \right\rceil & \text{if } \hat{x}[n] < 0 \end{cases}$$

where the symbols $\lfloor \cdot \rfloor$ and $\lceil \cdot \rceil$ denote, respectively, the floor and ceiling functions. Moreover, $M_i$ is the modulus of every EFM of the i-th level and $M=\prod_{i=1}^{T} M_i$. Each $EFM_{i,j}$ with i=1, 2, . . . , T−1 and j=2, . . . , L has the sum $(e_{i,(j-1)}[n]+y_{(i+1),j}[n])$ as input. In the case of all the stages of the T-th level, except for $EFM_{T,1}$, the input to the EFM is provided by the second output $e_{T,(j-1)}$ passed by the previous error feedback modulator stage in the cascade. In the case of $EFM_{T,1}$, the EFM is fed directly by $\hat{x}[n]$. Lastly, each first stage of every level but the last ($EFM_{i,1}$ with i=1, 2, . . . , T−1), has the sum $\hat{x}[n]+y_{(i+1),i}[n]$ as input. Then, the primary outputs of all the stages of the first level ($y_{1,j}$ with j=1, 2, . . . , L) are combined in the error cancellation network.

The frequency spectrum of the output of a fractional-N frequency synthesizer is characterized by phase noise and spurious tones (spurs). In addition to the so-called reference spur, which is due to the periodic update of the synthesizer at the reference frequency $f_{PD}$, the frequency spectrum contains so-called fractional spurs. These fractional spurs have their origins in the divider controller signal y[n] which is injected into the phase-locked loop.

One known technique for breaking the periodicity of the output of the divider controller is to introduce the additive random or pseudorandom dither signal d[n] at the input of the DDSM. The dither signal can be spectrally masked at the output of the DDSM by shaping it using a filter having a transfer function V(z), as illustrated in FIG. 3.

A typical third-order MASH 1-1-1 digital delta-sigma modulator with first-order shaped dither is illustrated in FIG. 6. The cascade comprises three first-order error feedback modulators (denoted $EFM_j$ with j=1, 2, 3) and an error cancellation network. Instead of first order filtering the pseudorandom binary dither signal d[n] with a transfer function $V(z)=(1-z^{-1})$ and summing the result at the input of the first stage, as shown in FIG. 3, the pseudorandom binary dither signal d is instead input to the second EFM stage to implement the required first order shaping.

In the z domain, $$Y(z) = STF(z)X(z) + DTF(z)D(z) - NTF(z)E_3(z),$$

where $STF(z) = \frac{1}{M}$, $$DTF(z) = \frac{1}{M}(1 - z^{-1}),$$

$$NTF(z) = \frac{1}{M}(1 - z^{-1})^3.$$

and Y(z), X(z), D(z) and $E_3$(Z) are the Z-transforms of y, x, the dither signal d, and the quantization error $e_3$[n] of the third EFM stage in FIG. 6. In particular, the power spectral densities (PSDs) of NTF(z) $E_3$(z) and DTF(z) D(z) are shown in FIG. 7.

The signal y[n] contains a first component that is related to the input signal x[n], a second component due to the dither signal d[n], and a third component that is due to the quantization error signal $e_3$[n]. The accumulation of the latter two zero-mean components, denoted $e_{acc}$[n−1], is introduced into the loop as unwanted phase noise, as shown in the phase domain model in FIG. 8.

The phase noise introduced by the divider controller is converted to a phase error, denoted $\Delta\phi_{in}$ in FIG. 8. This is distorted by a nonlinearity in the synthesizer, such as the one associated with the Phase Frequency Detector and Charge Pump (PFD/CP), denoted $\mathcal{N}(\cdot)$, to produce a signal denoted $\Delta\phi_{in}^{NL}$ in FIG. 8, which is equal to $$\Delta\phi_{in}^{NL}[n] = \frac{2\pi}{N_{div}}\mathcal{N}\left(\frac{N_{div}}{2\pi}\Delta\phi_{in}[n]\right)$$

The signal $\Delta\phi_{in}^{NL}$ passes through the linear component of the PFD/CP and the loop filter and is applied at the input of the VCO.

The spectrum of the signal $\Delta\phi_{in}$ is designed to be high-pass shaped and spur-free. However, when a nonlinearity is present, the spectrum of the signal $\Delta\phi_{in}^{NL}$ contains unwanted periodic frequency components (called spurs) and has an elevated low-frequency noise floor (called folded noise).

When this nonlinearly distorted signal is filtered and applied to the input of the VCO, the output phase noise spectrum of the synthesizer exhibits excess low frequency phase noise and spurs. Specifically, fractional spurs and noise are caused by interaction between the phase error signal $\Delta\phi$ and nonlinearity in the frequency synthesizer.

FIG. 9(a) compares the contribution of the modulation error to the phase noise spectrum of the output frequency $f_{VCO}$ when the system is linear, while FIG. 9(b) compares the contribution of the modulation error to the phase noise spectrum of the output frequency $f_{VCO}$ when the PFD/CP block has a nonlinear characteristic. FIG. 9(b) shows typical manifestations of a spur and folded noise that result from interaction between the signal injected by the divider controller and the nonlinearity.

FIG. 10 shows a block diagram of one known architecture for reducing fractional spurs in a synthesizer with a MASH divider controller in the presence of a memoryless polynomial nonlinearity. Compared to the structure in FIG. 6, an additional EFM stage is provided to form a MASH 1-1-1-1 architecture. When the nonlinearity $\mathcal{N}(\cdot)$ is a memoryless polynomial of order less than or equal to three, this divider controller does not introduce spurs in the fractional-N frequency synthesizer.

FIG. 11(a) shows the simulated spectrum of $S_{\phi_{out}}$ in respect of a frequency synthesizer with a DDSM comprising a first-order LSB dithered third-order Multi stAge noise SHaping (MASH) 1-1-1, such as that shown in FIG. 6, with first-order EFM stages, $M=2^{20}$ and x=127. The spectrum in FIG. 11(a) exhibits spurs which are caused by interaction between the quantization error signal introduced by the divider controller and the nonlinearity in the loop which has been modelled as a third-order polynomial.

FIG. 11(b) shows the simulated spectrogram of $S_{\phi_{out}}$ in respect of a frequency synthesizer with a DDSM comprising a first-order LSB dithered fourth-order MASH 1-1-1-1 with first-order EFM stages, $M=2^{20}$ and x=127, and a third-order polynomial nonlinearity. It can be seen that the higher order modulator does not exhibit spurs but has a higher low-frequency folded noise floor. The fractional spur has been suppressed by increasing the order of the DDSM from three to four.

Compared to the MASH 1-1-1 digital delta-sigma modulator in FIG. 6, additional hardware is required to implement the fourth stage and the larger error cancellation network of the MASH 1-1-1-1 modulator in FIG. 10. In addition, the dynamic range of the signal y[n] is larger, which affects the minimum division ratio that can be implemented in the multimodulus divider. Furthermore, the level of folded noise is significantly higher than in the case of the MASH 1-1-1 shown in FIG. 6.

It will be appreciated that fractional spurs and noise degrade the performance of the overall system in which the synthesizer is being used. This has been found to have a particular detrimental effect when the system is being used in applications such as communications, radar, and instrumentation.

Accordingly, it would be advantageous to be able to mitigate nonlinearity-induced fractional spurs in the presence of nonlinearities without introducing excessive additional folded noise.

SUMMARY OF THE EMBODIMENTS

Various embodiments of a divider controller, denoted ENOP-DDSM, for mitigating nonlinearity-induced spurs and noise in a fractional-N frequency synthesizer are disclosed.

Broadly speaking, a digital delta-sigma modulator (DDSM) is disclosed with an input signal x[n], an output signal y[n], a quantization error signal e[n] and a dither signal d[n], having an equation described in the z-domain by $$Y(z)=STF(z)X(z)+DTF(z)D(z)-NTF(z)E(z)$$

wherein Y(z), X(z), D(z) and E(z) are z-transforms of the output signal, the input signal, the dither signal and the quantization error signal, and wherein STF(z), DTF(z) and NTF(z) correspond to a transfer function of the input signal, a transfer function of the dither signal, and a transfer function of the quantization error signal, and wherein the transfer function of the quantization error signal is of the form:

$$NTF(z) = Az^{-Q}(1-z^{-1})\left(1+\sum_{i=1}^{K}c_i z^{-i}\right)$$

where A, Q and K are constants, coefficients $c_i$ are real valued and $c_K \neq 0$, and wherein at least one of the zeroes $z_j$ of $$\left(1+\sum_{i=1}^{K}c_i z^{-i}\right)$$

satisfies $z_j \neq +1$ for $j=1, 2, \ldots, K$.

In one embodiment, the coefficients $c_i$ are equal to $-1, 0$ or $1$.

In one embodiment, R of the coefficients $c_i$ are equal to $-1$, $(R-1)$ of the coefficients $c_i$ are equal to $+1$ and the other $(K-2R+1)$ of the coefficients $c_i$ are equal to zero, with $$R \le \frac{K+1}{2}.$$

In one embodiment, the z-domain equation is implemented with a multi-bit single-quantizer DDSM architecture.

In one embodiment, the z-domain equation is implemented with a multistage noise shaping cascaded DDSM architecture comprising an error cancellation network and $L \ge 2$ error feedback modulator (EFM) stages, wherein an error output $e_j$ of stage j is applied as an input to stage (j+1) and wherein outputs $y_j$ of the L stages are combined in the error cancellation network to provide the output y.

In one embodiment, wherein the Error Feedback Modulator (EFM) stages comprise a first portion and a second portion, wherein the first portion comprises (L-1) error feedback modulator stages and the second portion comprises the Lth error feedback modulator stage, wherein the first portion and the error cancellation network implement the noise transfer function $$NTF_A(z)=A_A z^{-Q_A}(1-z^{-1})^S$$

where $A_A$ and $Q_A$ are constants and S is equal to $\sum_{i=1}^{L-1} s_i$, where $s_i$ is the order of the $EFM_i$ wherein the noise transfer function $NTF_i(z)=A_i z^{-Q_i}(1-z^{-1})^{s_i}$ where $A_i$ and $Q_i$ are constants with $i=1, 2, \ldots L-1$, and wherein the second portion implements the noise transfer function $$NTF_B(z) = A_B z^{-Q_B}(1-z^{-1})^{(1-S)}\left(1+\sum_{i=1}^{K}c_i z^{-i}\right)$$

wherein $A_B$, $Q_B$ are constants.

In one embodiment, wherein the L Error Feedback Modulator (EFM) stages comprise a first portion and a second portion, wherein the first portion comprises (L-1) error feedback modulator stages and the second portion comprises the Lth error feedback modulator stage, wherein the first portion and the error cancellation network implement the noise transfer function $$NTF_A(z) = \frac{(1-z^{-1})^S}{M}$$

where S is equal to $\sum_{i=1}^{L-1} s_i$, where $s_i$ is the order of the $EFM_i$ wherein the noise transfer function $NTF_i(z)=M^{-1}(1-z^{-1})^{s_i}$ with $i=1, 2, \ldots L-1$, and wherein the second portion implements the noise transfer function $$NTF_B(z) = \frac{(1-z^{-1})^{(1-S)}}{M}\left(1+\sum_{i=1}^{K}c_i z^{-i}\right)$$

In one embodiment, L=3.

In one embodiment, the z-domain equation is implemented with an error cancellation network and a nested cascaded structure comprising a plurality of error feedback modulator (EFM) stages connected in a plurality of levels.

In one embodiment, the nested cascaded structure comprises T levels of L error feedback modulator (EFM) stages comprising a first portion and a second portion, wherein the first portion comprises (L-1) error feedback modulator stages of each level and the second portion comprises the Lth error feedback modulator stage of each level, wherein the first portion and the error cancellation network implement the noise transfer function $$NTF_A(z)=A_A z^{-Q_A}(1-z^{-1})^S$$

where $A_A$, $Q_A$ are constants and S is equal to $\sum_{j=1}^{L-1} s_j$, where $s_j$ is the order of the $EFM_{i,j}$ wherein the noise transfer function $NTF_{i,j}(z)=A_{i,j}z^{-Q_{i,j}}(1-z^{-1})^{s_j}$ where $A_{i,j}$ and $Q_{i,j}$ are constants with $i=1, 2, \ldots T$ and $j=1, 2, \ldots L-1$, and wherein the second portion implements the noise transfer function $$NTF_B(z) = A_B z^{-Q_B}(1-z^{-1})^{(1-S)}\left(1+\sum_{i=1}^{K}c_i z^{-i}\right)$$

wherein $A_B$, $Q_B$ are constants.

In one embodiment, the nested cascaded structure comprises T levels of L error feedback modulator (EFM) stages comprising a first portion and a second portion, wherein the first portion comprises (L-1) error feedback modulator stages of each level and the second portion comprises the Lth error feedback modulator stage of each level, wherein the first portion and the error cancellation network implement the noise transfer function $$NTF_A(z) = \frac{(1-z^{-1})^S}{M}$$

where S is equal to $\sum_{j=1}^{L-1} s_j$, where $s_j$ is the order of the $EFM_{i,j}$ wherein the noise transfer function $NTF_{i,j}(z)=M_i^{-1}(1-z^{-1})^{s_j}$ with $i=1, 2, \ldots T$ and $j=1, 2, \ldots L-1$, and wherein the second portion implements the noise transfer function $$NTF_B(z) = \frac{(1-z^{-1})^{(1-S)}}{M}\left(1+\sum_{i=1}^{K}c_i z^{-i}\right)$$

In one embodiment, the coefficients $c_i$ are valued such that the noise transfer function can be represented in the form:

$$NTF(z) = Az^{-Q}\left(1 + \sum_{i=1}^{K+1} d_i z^{-i}\right)$$

wherein coefficients $d_i$ are equal to $-1$, $0$ or $1$, and $$\sum_{i=1}^{K+1} |d_i| \leq -1 + 2\sum_{i=1}^{K} |c_i|$$

In one embodiment, the coefficients $c_i$ are equal to $-1$, $0$ or $1$.

In yet another embodiment, a fractional-N PLL device is disclosed comprising:
a voltage controlled oscillator,
a phase-locked loop comprising a multimodulus divider, wherein the phase-locked loop generates an output frequency from the voltage controlled oscillator; and the disclosed digital delta-sigma modulator for providing a sequence of integers to control the multimodulus divider to settle to a desired fraction.

BRIEF DESCRIPTION OF THE DRAWINGS

The present disclosure will be more clearly understood from the following description of an embodiment thereof, given by way of example only, with reference to the accompanying drawings, in which.

DETAILED DESCRIPTION

The present disclosure provides a DDSM-based divider controller suitable for use with a PLL-based fractional-N frequency synthesizer which Enhances the Nonlinearity-induced noise Performance, denoted ENOP-DDSM. This modulator mitigates the spurs and minimizes the folded noise that arise when used with a synthesizer due to interaction between the quantization signal introduced by the divider controller and a memoryless polynomial nonlinearity in the PLL. The present disclosure will now be described in conjunction with FIG. 12 onwards.

The digital delta sigma modulator (DDSM) of the disclosure implements the z domain governing equation $$Y(z)=STF(z)X(z)+DTF(z)D(z)-NTF(z)E(z),$$

where Y(z), X(z), D(z) and E(z) are the z transforms of the output, primary input, secondary (dither) input, and quantization error of the DDSM, and wherein STF(z), DTF(z) and NTF(z) are the transfer functions from the primary input, dither input and quantization error to the output and wherein NTF (z) is of the form:

$$NTF(z) = Az^{-Q}(1-z^{-1})\left(1+\sum_{i=1}^{K}c_i z^{-i}\right)$$

where A, Q and K are constants, all the coefficients $c_i$ are real valued and at least one of the zeroes $z_j$ of $$\left(1+\sum_{i=1}^{K}c_i z^{-i}\right)$$

satisfies $z_j \neq +1$ for j=1, 2, . . . , K.

Taking $Az^{-Q}$ to be equal to 1/M, the divider controller of the disclosure thus implements a Noise Transfer Function $$NTF(z) = \frac{(1-z^{-1})}{M}\left(1+\sum_{i=1}^{K}c_i z^{-i}\right)$$

In one embodiment, the coefficients $c_i$ are equal to −1, 0 or 1.

In one embodiment, R number of the coefficients $c_i$ are equal to −1, (R−1) number of the coefficients $c_i$ are equal to +1 and the other (K−2R+1) number of the coefficients $c_i$ are equal to zero, with $$R \leq \frac{K+1}{2}.$$

In one embodiment, the coefficients $c_i$ are valued such that the noise transfer function can be represented in the form:

$$NTF(z) = Az^{-Q}\left(1+\sum_{i=1}^{K+1}d_i z^{-i}\right)$$

wherein coefficients $d_i$ are equal to −1, 0 or 1, and $$\sum_{i=1}^{K+1}|d_i| \leq -1 + 2\sum_{i=1}^{K}|c_i|$$

Figure 12:
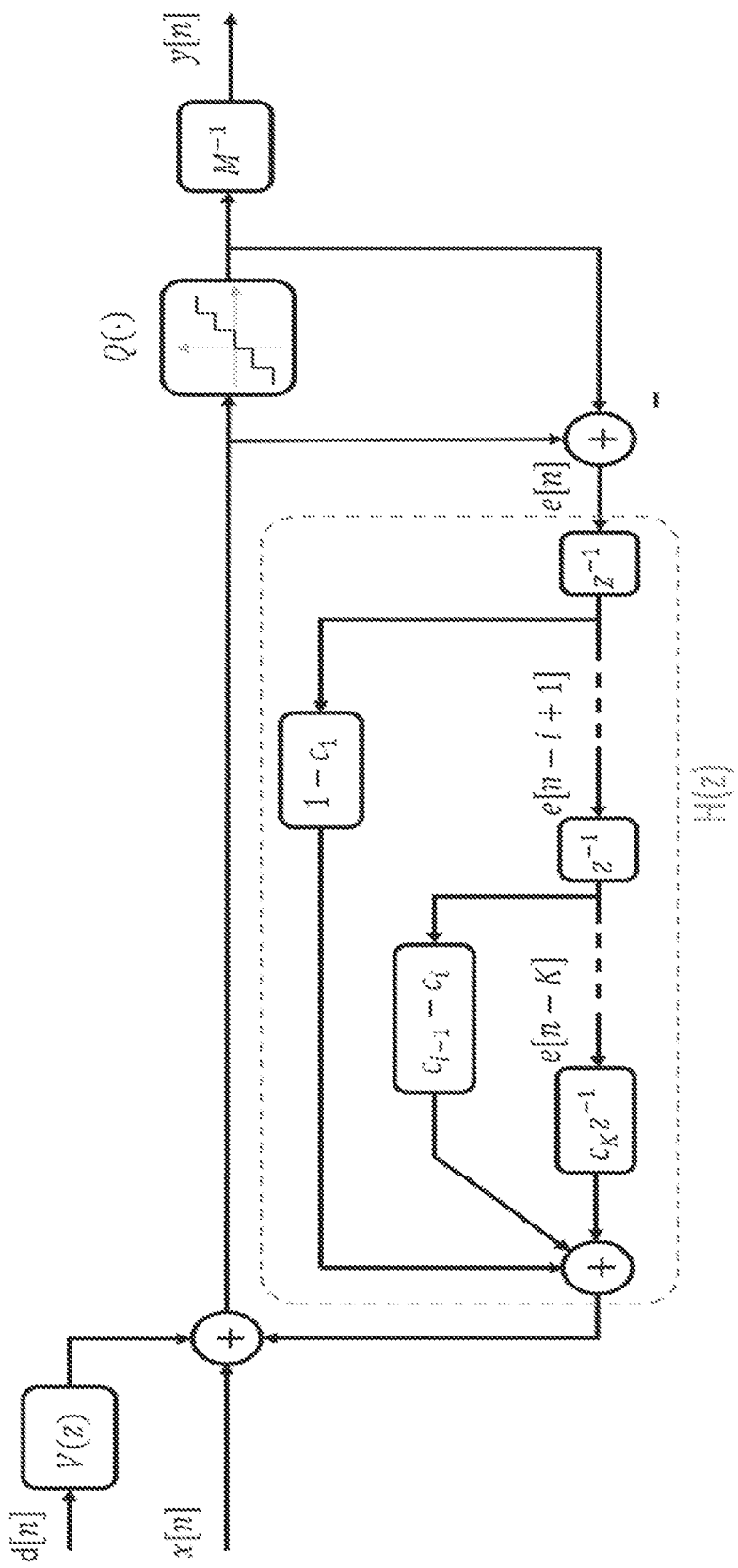
FIG. 12 shows a block diagram of an embodiment of a single quantizer low spur and noise divider controller in accordance with the present disclosure.

FIG. 12 shows a first embodiment of the present disclosure where the divider controller comprises a single Error Feedback Modulator (EFM) stage that constitutes a single quantizer digital delta-sigma modulator.

Figure 13:
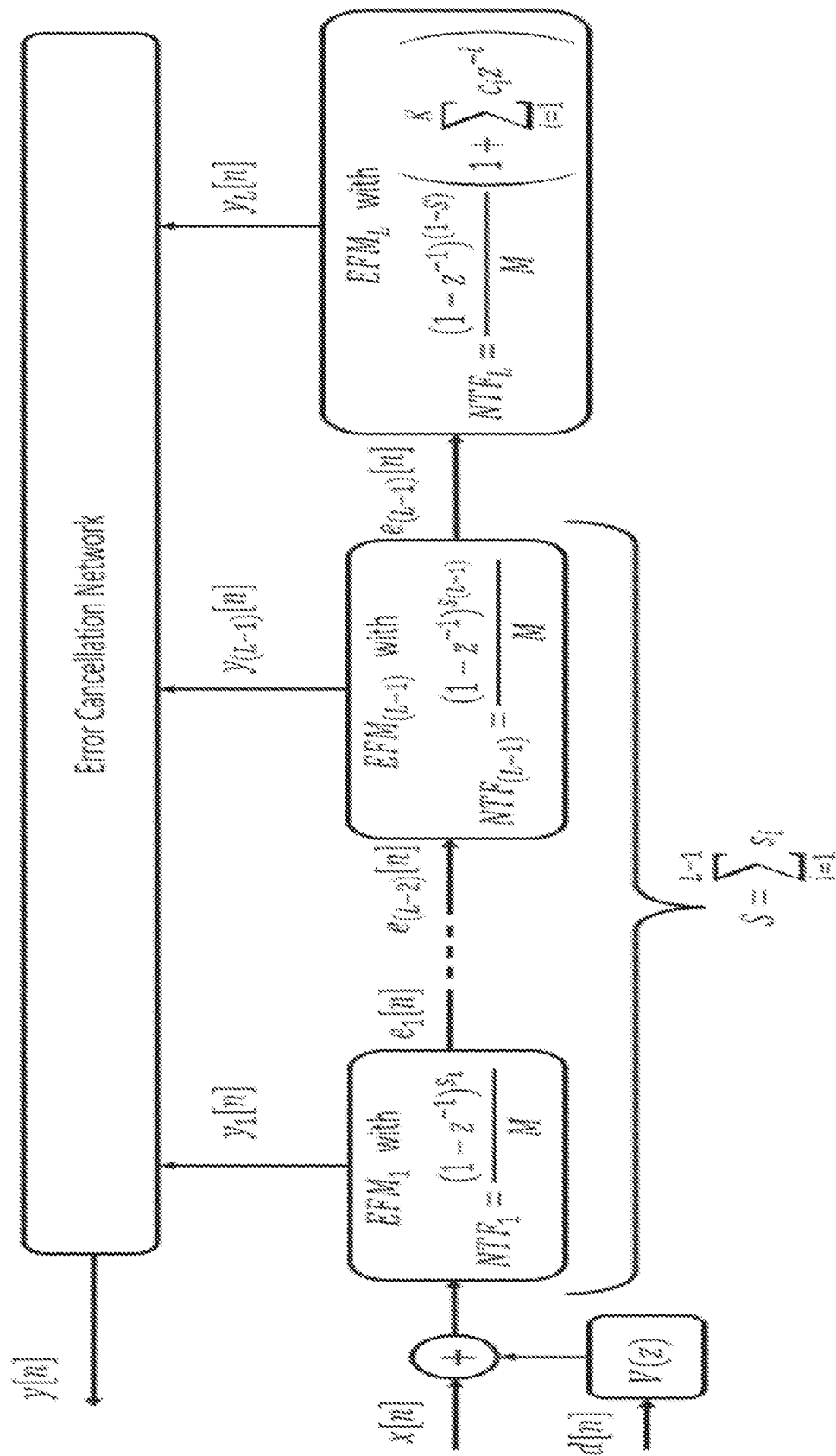
FIG. 13 shows a block diagram of an embodiment of an L-stage low spur and noise cascaded ENOP-DDSM divider controller in accordance with the present disclosure, where the first (L−1) stages and the error cancellation network are configured to implement a noise transfer function $NTF_A(z)$ and the Lth stage is an error feedback modulator with noise transfer function $NTF_B(z)$.

FIG. 13 shows a second embodiment of the present disclosure where the divider controller comprises an error cancellation network and a cascade of L number single quantizer or Error Feedback Modulator (EFM) stages, wherein the L Error Feedback Modulator (EFM) stages comprise a first portion and a second portion. The first portion comprises (L−1) stages and the second portion comprises the Lth stage. The first portion, together with the error cancellation network, implements a Noise Transfer Function $$NTF_A(z) = \frac{(1-z^{-1})^S}{M}$$

where S is equal to $\Sigma_{i=1}^{L-1} s_i$, where $s_i$ is the order of the $EFM_i$, wherein the noise transfer function $NTF_i(z)=M^{-1}(1-z^{-1})^{s_i}$ with i=1, 2, . . . L−1. The second portion, comprising the Lth stage, is configured to implement a Noise Transfer Function $$NTF_B(z) = \frac{(1-z^{-1})^{(1-S)}}{M}\left(1+\sum_{i=1}^{K}c_i z^{-i}\right),$$

so as to give the overall Noise Transfer Function for the modulator set out previously.

Each of the L stages may be implemented with pipelined combinatorial logic. The outputs of the L stages are combined in the error cancellation network to yield the output y.

Divider controllers with constant inputs are known to suffer from limit cycles. Therefore, a binary dither signal, denoted d[n], is added into the signal chain to prevent limit cycle behavior.

In one embodiment, R number of the coefficients $c_i$ are equal to −1, (R−1) number of the coefficients $c_i$ are equal to +1 and the other (K−2R+1) number of the coefficients $c_i$ are equal to zero, with $$R \leq \frac{K+1}{2}.$$

For example, with K=6 and R=3, the Noise Transfer Function $$NTF(z)=M^{-1}(1-z^{-1})(1-z^{-1}+z^{-2}-z^{-3}-z^{-4}+z^{-6}),$$

can be implemented in the multistage cascaded structure of FIG. 13 by partitioning factors of the NTF between a number of different stages.

By choosing S=1, the NTF can be realized by a cascade of two stages wherein the NTF of one stage is $$NTF(z)=M^{-1}(1-z^{-1})$$

and the NTF of the other stage is $$NTF(z)=M^{-1}(1-z^{-1}+z^{-2}-z^{-3}-z^{-4}+z^{-6}).$$

By choosing S=2, the NTF can be written $$NTF(z)=M^{-1}(1-z^{-1})^2(1+z^{-2}-z^{-4}-z^{-5}),$$

and implemented with a three-stage cascaded structure wherein two EFM stages have NTFs of $$NTF(z)=M^{-1}(1-z^{-1})$$

and the NTF of the remaining stage is $$NTF(z)=M^{-1}(1+z^{-2}-z^{-4}-z^{-5}).$$

Equivalently, with S=2, the NTF can also be implemented with a two-stage cascaded structure wherein one EFM stage has NTF of $$NTF(z)=M^{-1}(1-z^{-1})^2$$

and the NTF of the other stage is $$NTF(z)=M^{-1}(1+z^{-2}-z^{-4}-z^{-5}).$$

By choosing S=3, the NTF can be expressed as $$NTF(z)=M^{-1}(1-z^{-1})^3(1+z^{-1}+2z^{-2}+2z^{-3}+z^{-4}),$$

and implemented with a four-stage cascaded structure wherein three identical EFM stages have NTFs of $$NTF(z)=M^{-1}(1-z^{-1})$$

and the NTF of the fourth stage is $$NTF(z)=M^{-1}(1+z^{-1}+2z^{-2}+2z^{-3}+z^{-4})$$

Moreover, the same NTF can be implemented with a three-stage cascaded structure wherein one stage has NTF of $$NTF(z)=M^{-1}(1-z^{-1}),$$

another stage has NTF of $$NTF(z)=M^{-1}(1-z^{-1})^2$$

and the remaining stage has NTF of $$NTF(z)=M^{-1}(1+z^{-1}+2z^{-2}+2z^{-3}+z^{-4}).$$

Lastly, also with S=3, the NTF can be implemented with a two-stage cascaded structure wherein one stage has NTF of $$NTF(z)=M^{-1}(1-z^{-1})^3$$

and the remaining stage has NTF of $$NTF(z)=M^{-1}(1+z^{-1}+2z^{-2}+2z^{-3}+z^{-4}).$$

It should be clear that a number of different, but equivalent, partitions of the NTF are possible. The spurious tone immunity derives from the structure of the NTF rather than any particular implementation.

Figure 14:
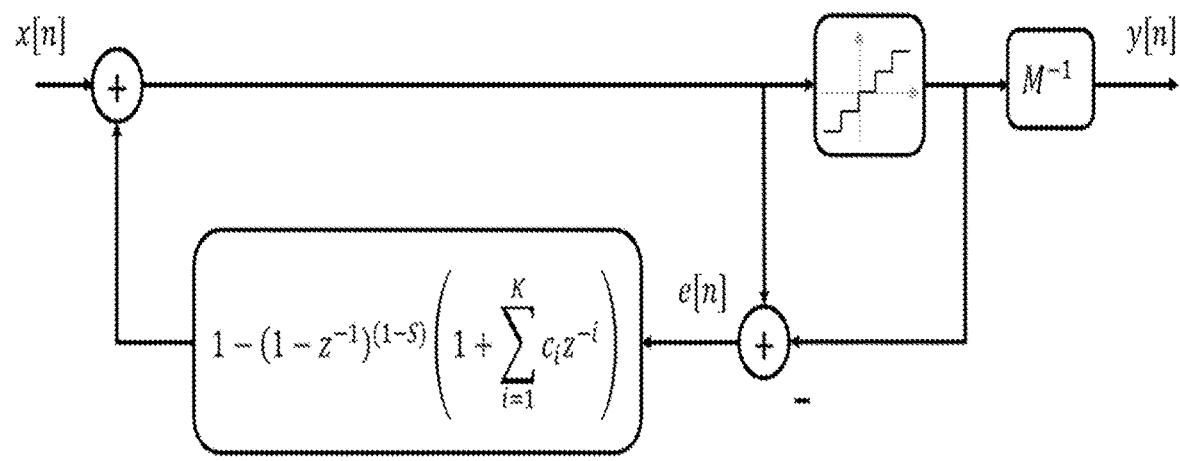
FIG. 14 shows a block diagram of an embodiment of the error feedback modulator in the Lth stage of the L-stage low spur and noise cascaded ENOP-DDSM divider controller in accordance with the present disclosure.

FIG. 14 shows an implementation of the Lth stage of FIG. 13. The output Y(z) is defined by $$Y(z)=STF(z)X(z)-NTF_B(z)E(z)$$

Figure 15:
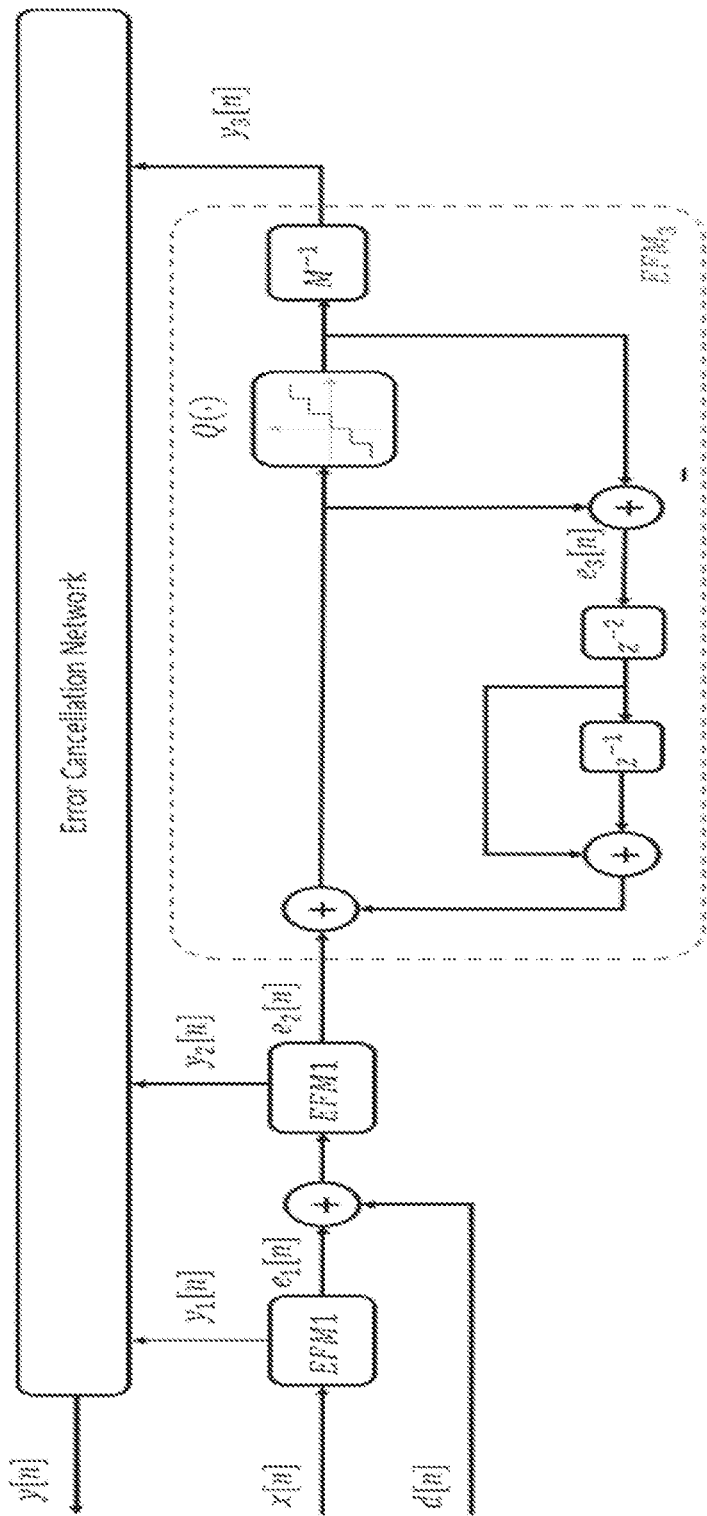
FIG. 15 shows a block diagram of an embodiment of a three-stage low spur and noise cascaded ENOP-DDSM divider controller in accordance with the present disclosure, where the first two stages are first-order error feedback modulators each with a noise transfer function $M^{-1}(1-z^{-1})$ and the third stage is an error feedback modulator with noise transfer function $M^{-1}(1-z^{-2}-z^{-3})$.

FIG. 15 shows an implementation of the divider controller in FIG. 13 with L=3 and S=2. Here, the dither signal d[n] has been added after the first stage to implement first-order shaping.

In the embodiment of the three-stage cascade in FIG. 15, K=4 and R=2. In particular, the first two stages, $EFM_1$ and $EFM_2$, are first-order EFMs and have noise transfer functions $$NTF_1(z)=NTF_2(z)=M^{-1}(1-z^{-1})$$

and $EFM_3$ has noise transfer function $$NTF_3(z)=M^{-1}(1-z^{-2}-z^{-3}),$$

giving an overall Noise Transfer Function for the modulator of $$NTF(z)=M^{-1}(1-z^{-1})^2(1-z^{-2}-z^{-3}).$$

Figure 16:
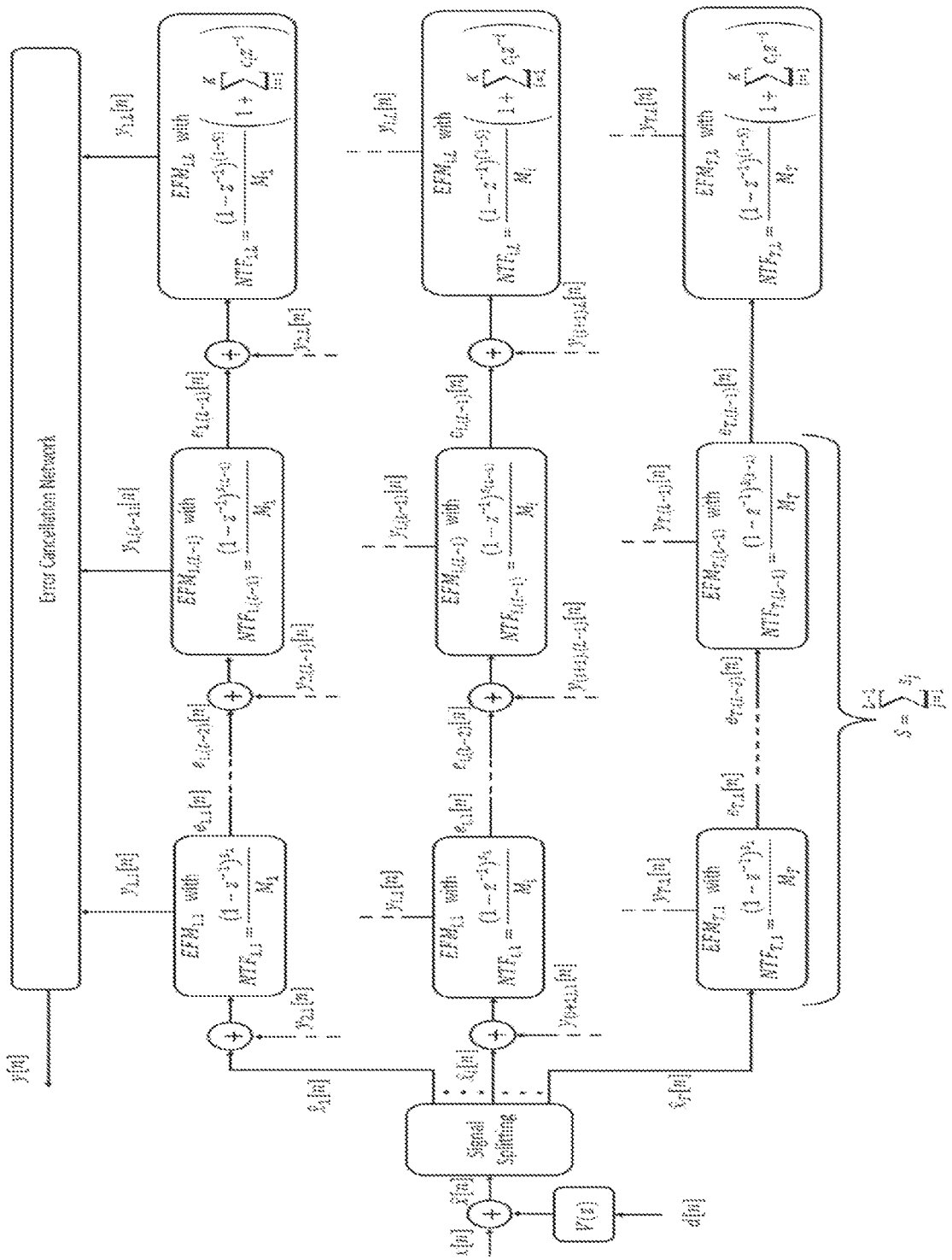
FIG. 16 shows a block diagram of an embodiment of a T-level and L-stage low spur and noise nested cascaded divider controller in accordance with the present disclosure, wherein each level comprises (L−1) cascaded stages that together and with the error cancellation network implement a noise transfer function $NTF_A(z)$ and the remaining stages, one for each level, are configured to implement a noise transfer function $NTF_B(z)$.

FIG. 16 shows a third embodiment of the present disclosure where the divider controller comprises an error cancellation network and T levels of L cascaded single quantizer stages comprising a first portion and a second portion. The first portion comprises (L−1) error feedback modulator stages of each level and the second portion comprises the Lth error feedback modulator stage of each level. The first portion together with the error cancellation network, implement the Noise Transfer Function $$NTF_A(z) = \frac{(1-z^{-1})^S}{M}$$

where S is equal to $\Sigma_{j=1}^{L-1} s_j$, where $s_j$ is the order of the $EFM_{i,j}$ wherein the noise transfer function $NTF_{i,j}(z)=M_i^{-1}(1-z^{-1})^{s_j}$ with i=1, 2, . . . T and j=1, 2, . . . L−1. The second portion implements the Noise Transfer Function $$NTF_B(z) = \frac{(1-z^{-1})^{(1-S)}}{M}\left(1+\sum_{i=1}^{K}c_iz^{-i}\right),$$

so as to give the overall Noise Transfer Function for the modulator set out previously.

The outputs of the L stages of the first cascade are combined in the error cancellation network to yield the output y.

In one embodiment, R number of the coefficients $c_i$, are equal to −1, (R−1) number of the coefficients $c_i$ are equal to +1 and the other (K−2R+1) number of the coefficients $c_i$ are equal to zero, with $$R \le \frac{K+1}{2}.$$

Once again, it should be clear that a number of different, but equivalent, partitions of the NTF over T levels are possible. The spurious tone immunity derives from the structure of the NTF rather than the particular implementation.

Divider controllers with constant inputs are known to suffer from limit cycles. Therefore, a binary dither signal, denoted d[n], is added into the signal chain to prevent limit cycle behavior.

Figure 17:
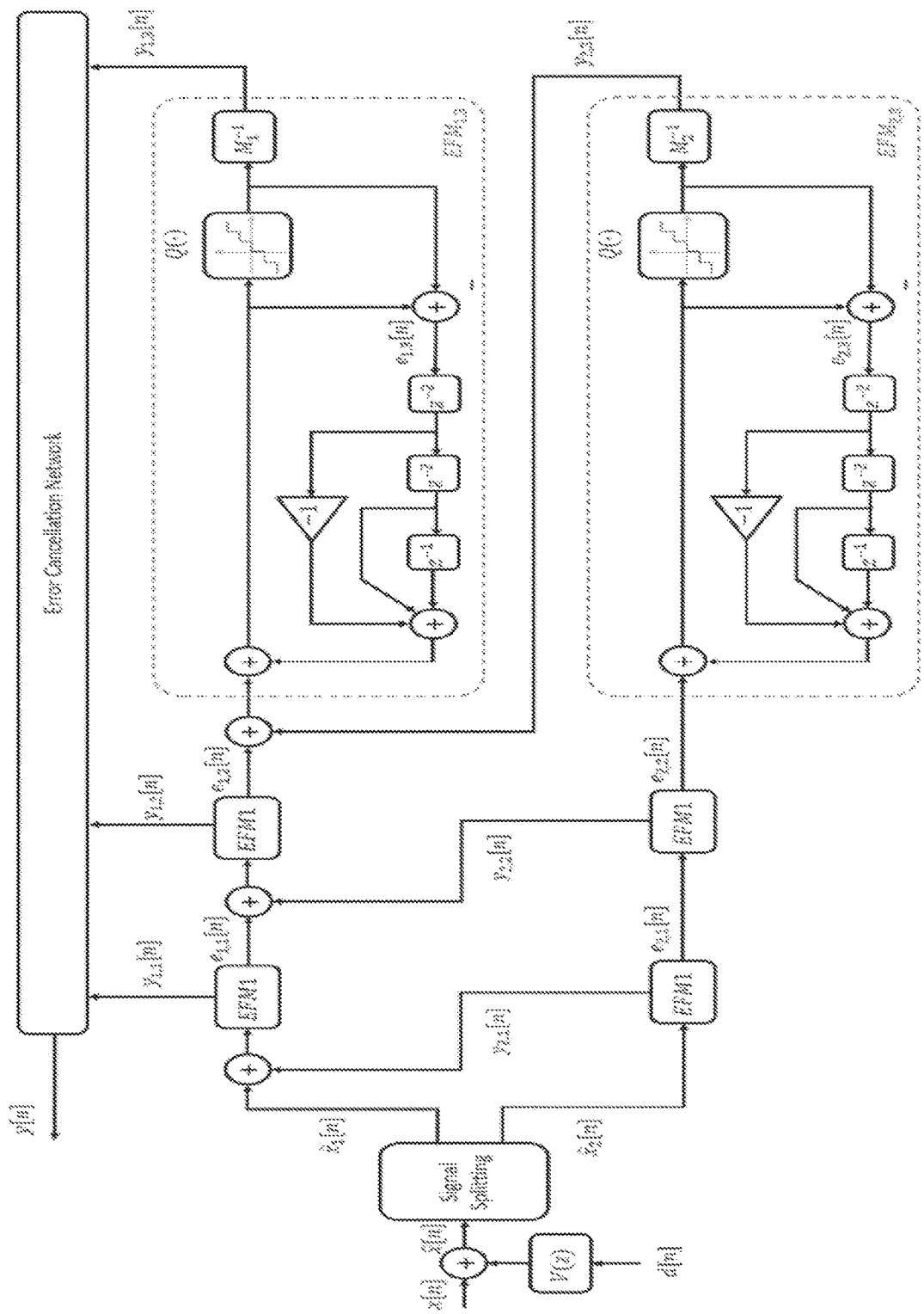
FIG. 17 shows a block diagram of an embodiment of a two-level, three-stage low spur and noise nested cascaded divider controller in accordance with the present disclosure, where for each level i the first two stages are first-order error feedback modulators, each with a noise transfer function $M_i^{-1}(1-z^{-1})$ and the third stage is an error feedback modulator with noise transfer function $M_i^{-1}(1+z^{-2}-z^{-4}-z^{-5})$.

FIG. 17 shows an implementation of the divider controller in FIG. 16 with T=2, L=3 and S=2. The 20-bit input word x[n] added to the filtered dither is partitioned into two smaller 10-bit words $\hat{x}_i[n]$. The outputs of the stages of the second cascade are added to the inputs of the stages of the first cascade.

In the embodiment of the three-stage nested cascade in FIG. 17, K=6 and R=3. In particular, the first two stages of both levels are first-order EFMs and have noise transfer functions $$NTF_{1,1}(z)=NTF_{1,2}(z)=M_1^{-1}(1-z^{-1})$$

$$NTF_{2,1}(z)=NTF_{2,2}(z)=M_2^{-1}(1-z^{-1})$$

and the remaining stages have noise transfer functions $$NTF_{1,3}(z)=M_1^{-1}(1+z^{-2}-z^{-4}-z^{-5})$$

$$NTF_{2,3}(z)=M_2^{-1}(1+z^{-2}-z^{-4}-z^{-5}).$$

giving an overall Noise Transfer Function for the modulator of $$NTF(z)=M^{-1}(1-z^{-1})^2(1+z^{-2}-z^{-4}-z^{-5})$$

Figure 1:
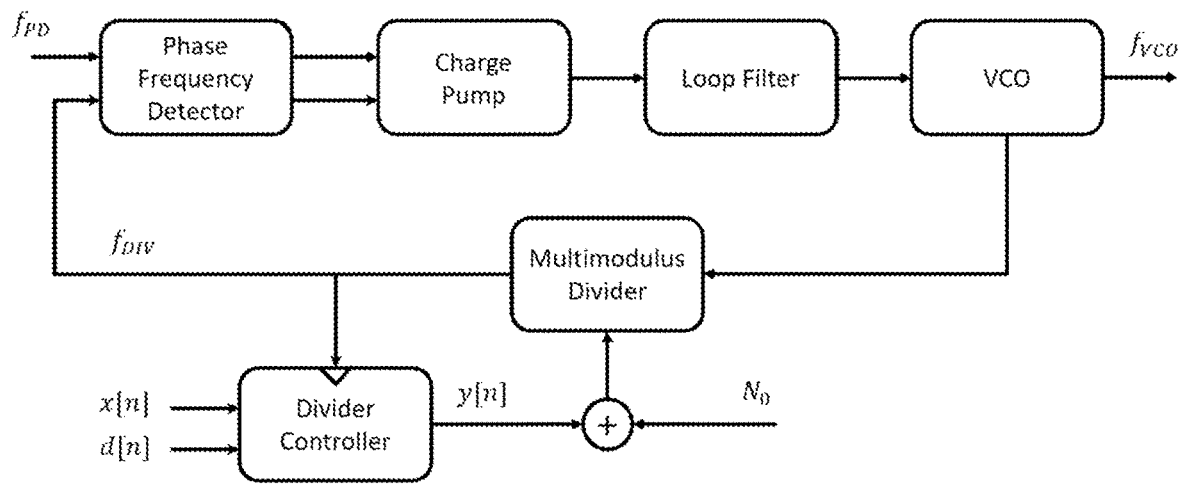
FIG. 1 shows a block diagram of a conventional fractional-N frequency synthesizer.
Figure 2A:
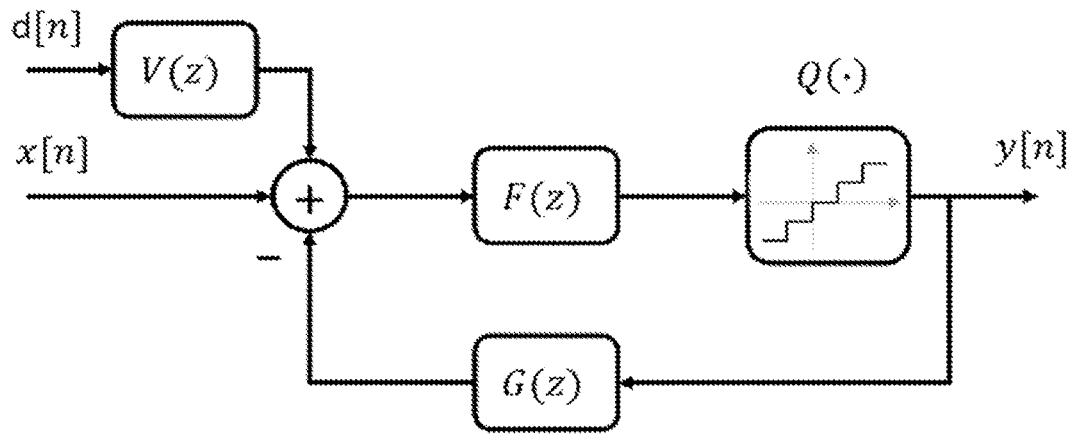
FIG. 2(a) shows the block diagram of a conventional divider controller based on a single quantizer digital delta-sigma modulator with shaped additive dither.
Figure 2B:
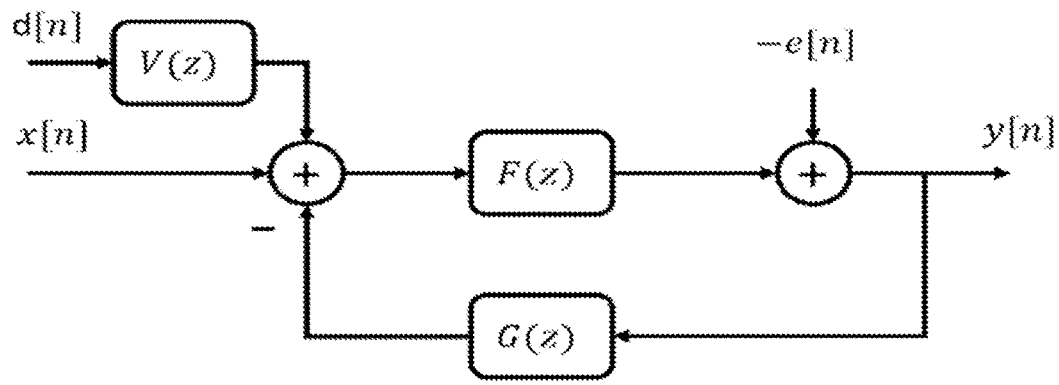
FIG. 2(b) shows the linearized model of the conventional divider controller of FIG. 2(a)
Figure 3:
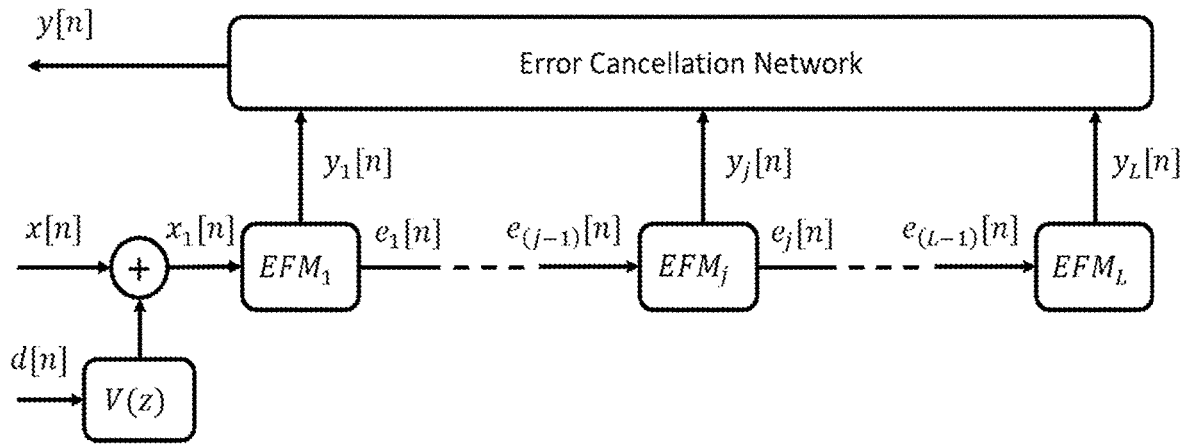
FIG. 3 shows a block diagram of a conventional divider controller based on a Multi stAge noise SHaping (MASH) digital delta-sigma modulator with shaped additive dither.
Figure 4A:
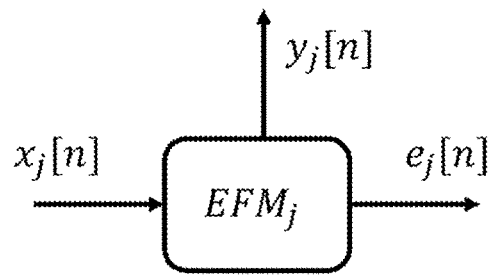
FIG. 4(a) shows a block diagram of a conventional Error Feedback Modulator (EFM)
Figure 4B:
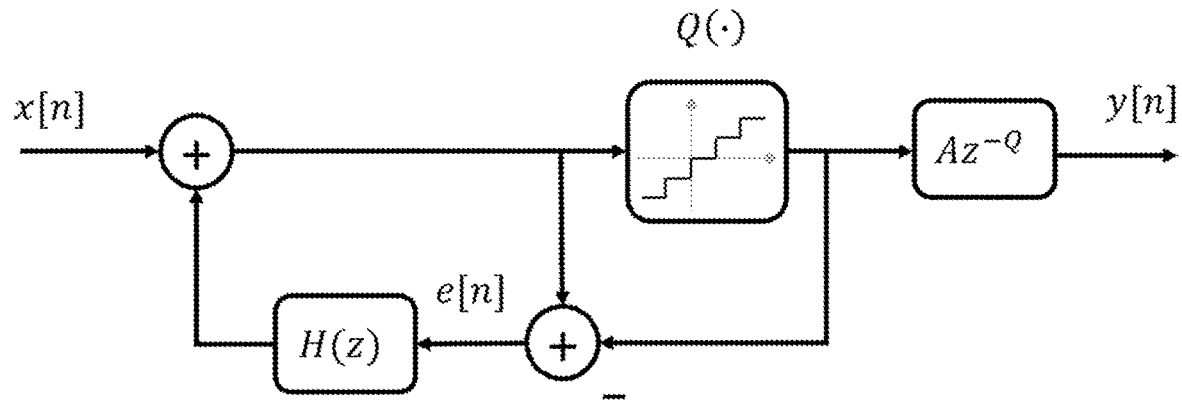
FIG. 4(b) shows an implementation of the conventional Error Feedback Modulator (EFM) of FIG. 4(a)
Figure 5:
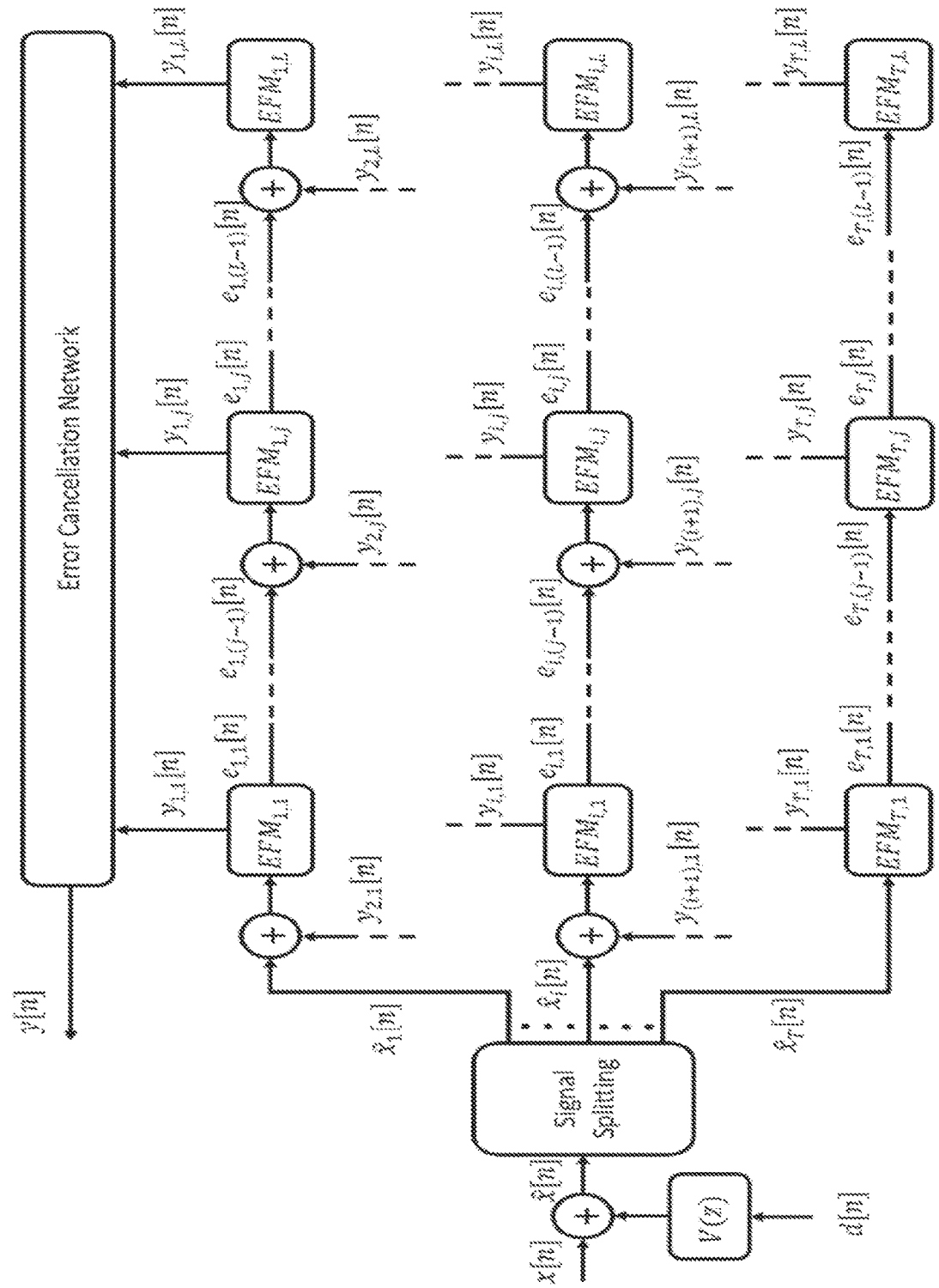
FIG. 5 shows a block diagram of a conventional divider controller based on a nested cascaded MASH digital delta-sigma modulator with shaped additive dither.
Figure 6:
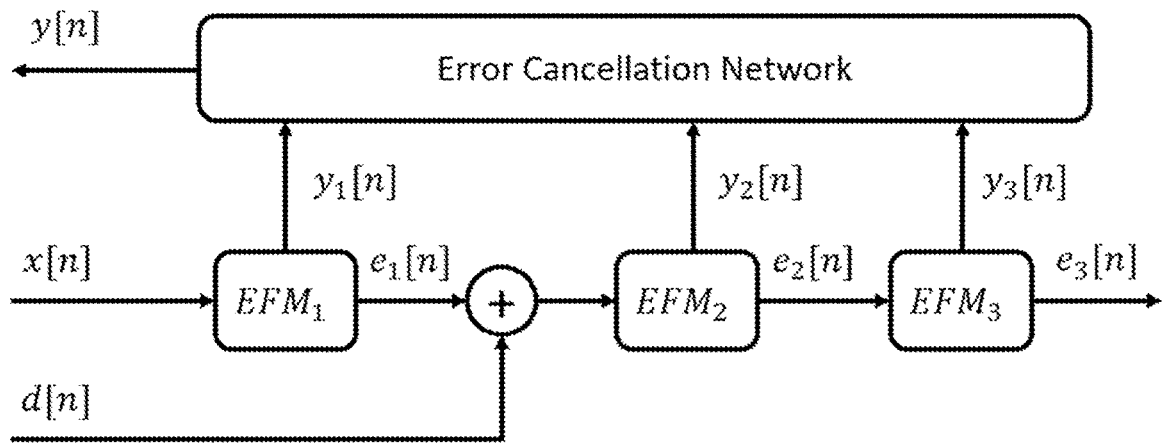
FIG. 6 shows a block diagram of a conventional additive LSB-dithered MASH 1-1-1 divider controller with first-order shaped additive dither.
Figure 7:
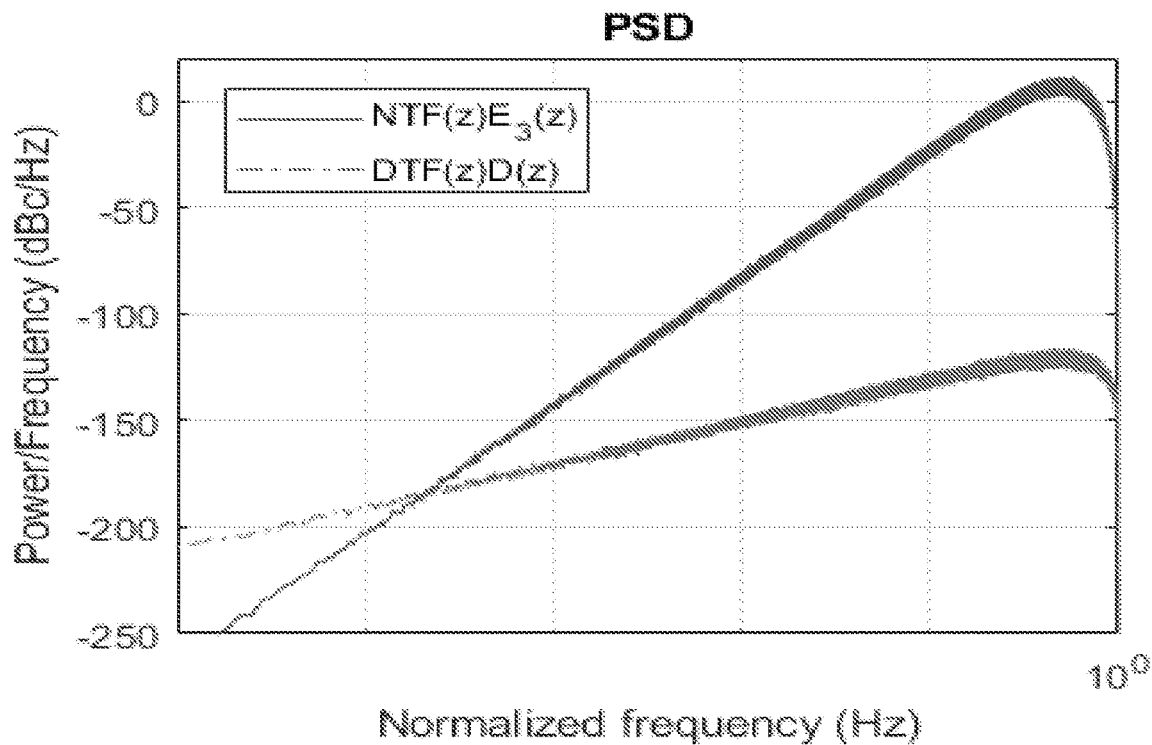
FIG. 7 shows simulated spectra of the zero-mean shaped dither and shaped quantization noise introduced by the divider controller.
Figure 8:
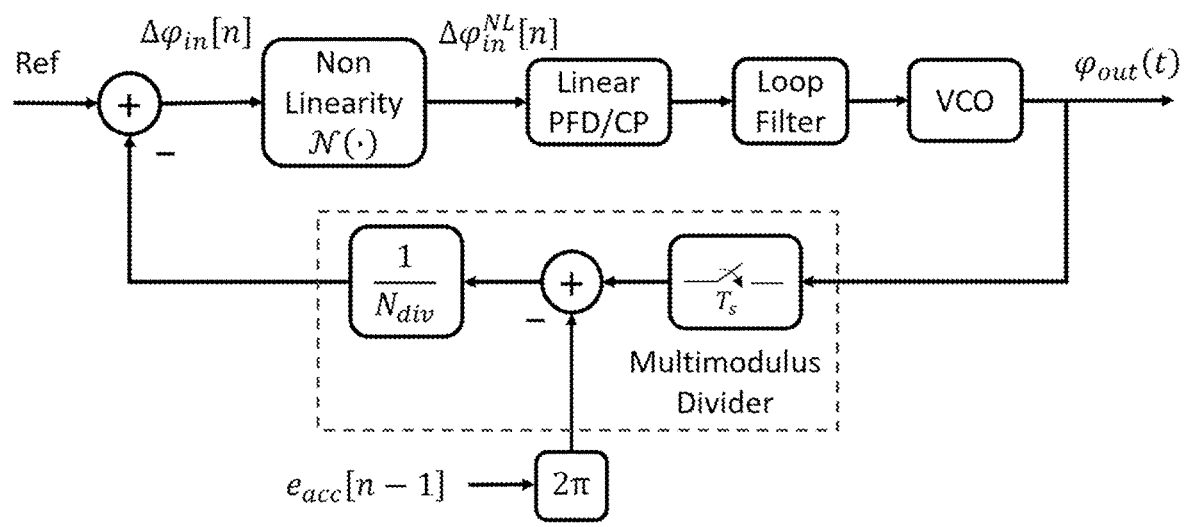
FIG. 8 shows a simplified phase domain model of a fractional-N frequency synthesizer.
Figure 9A:
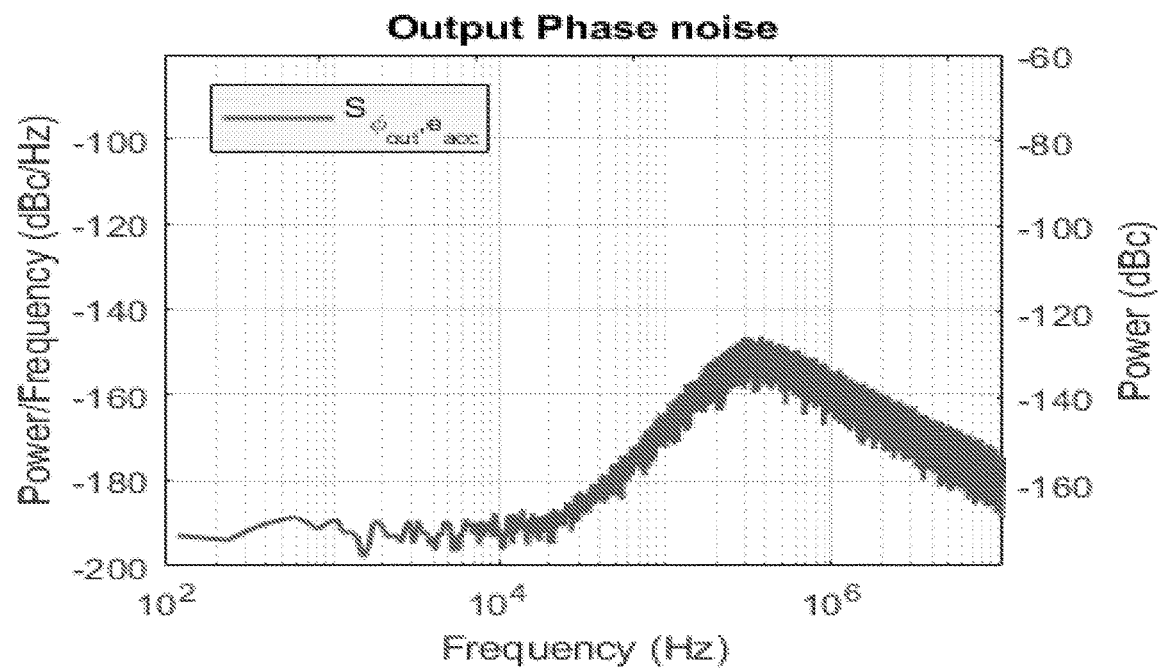
FIG. 9(a) shows simulated contributions to the output phase noise spectrum of the synthesizer from the divider controller in FIG. 6 without nonlinear distortion.
Figure 9B:
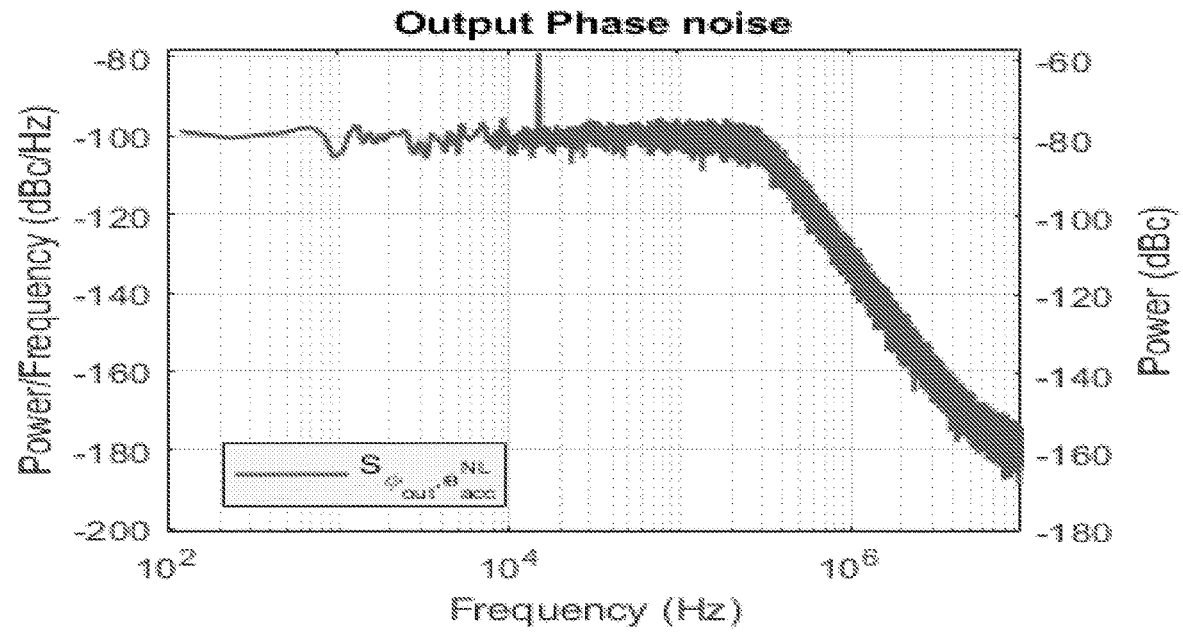
FIG. 9(b) shows simulated contributions to the output phase noise spectrum of the synthesizer from the divider controller in FIG. 6 with nonlinear distortion.
Figure 10:
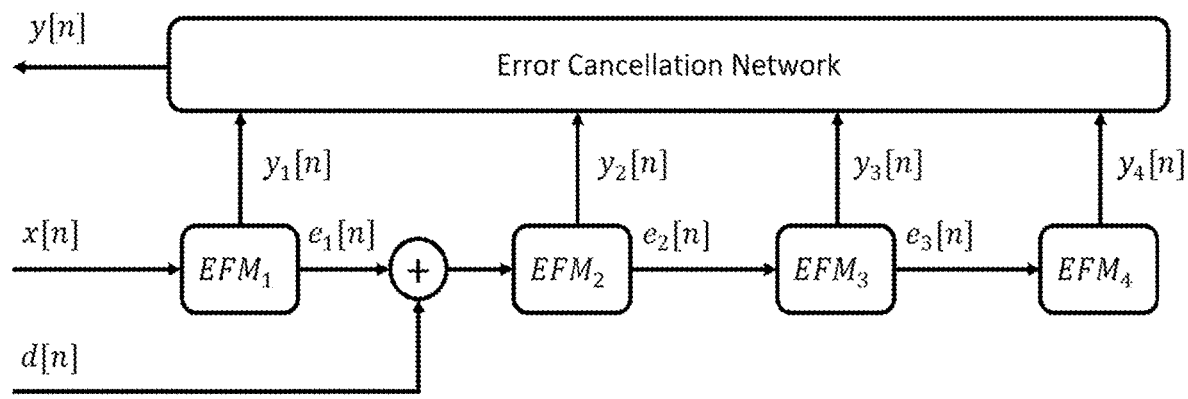
FIG. 10 shows a block diagram of a conventional additive LSB-dithered MASH 1-1-1-1 divider controller with first-order shaped additive dither.
Figure 11A:
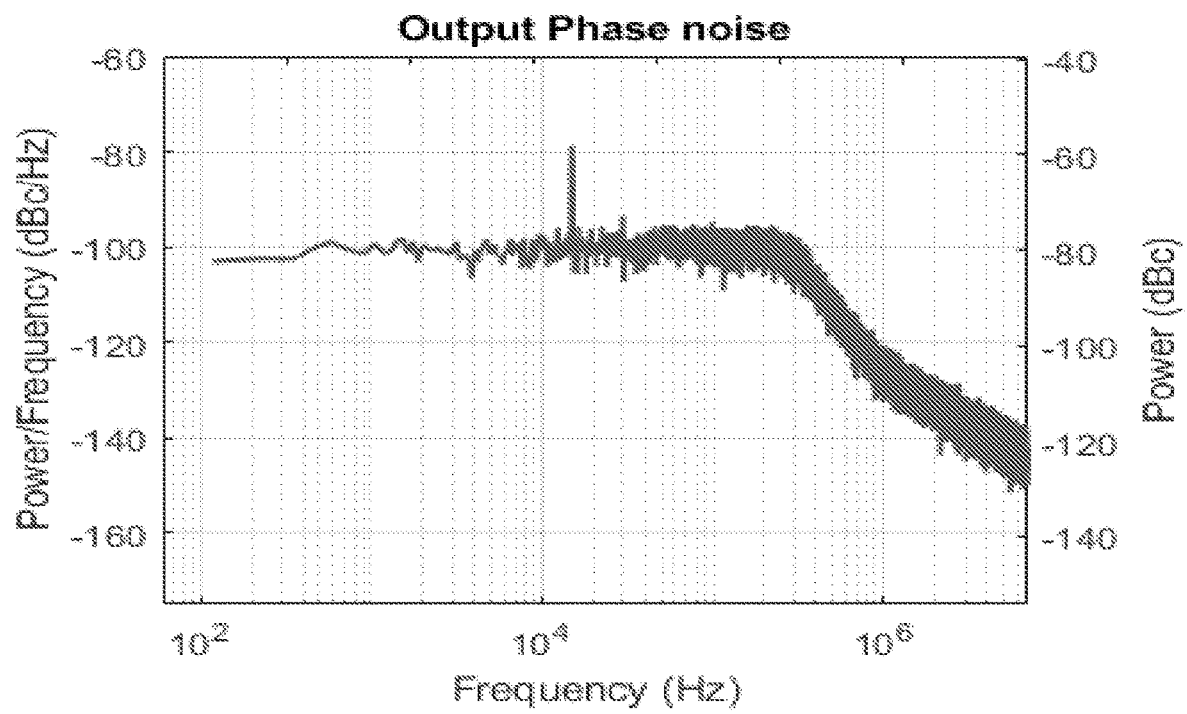
FIG. 11(a) shows simulated contributions to the output phase noise spectrum of the synthesizer from the dithered MASH 1-1-1 divider controller in FIG. 6 with third order nonlinear distortion.
Figure 11B:
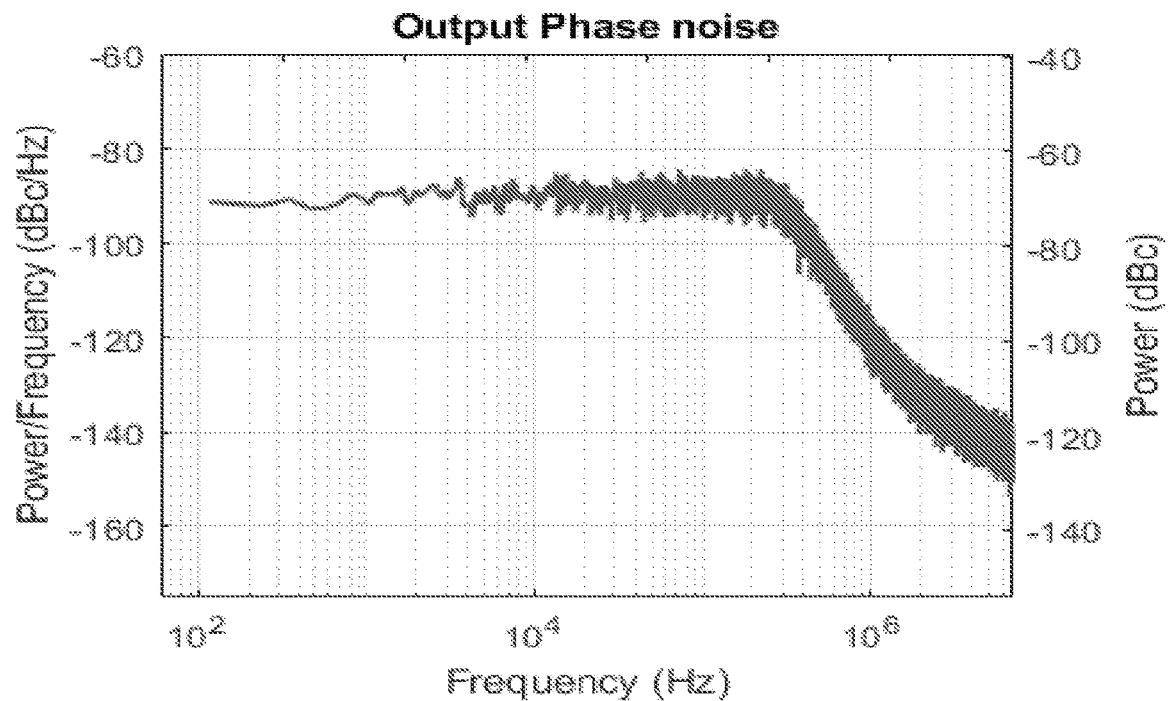
FIG. 11(b) shows simulated contributions to the output phase noise spectrum of the synthesizer from the dithered MASH 1-1-1-1 divider controller in FIG. 10 with third order nonlinear distortion.
Figure 18:
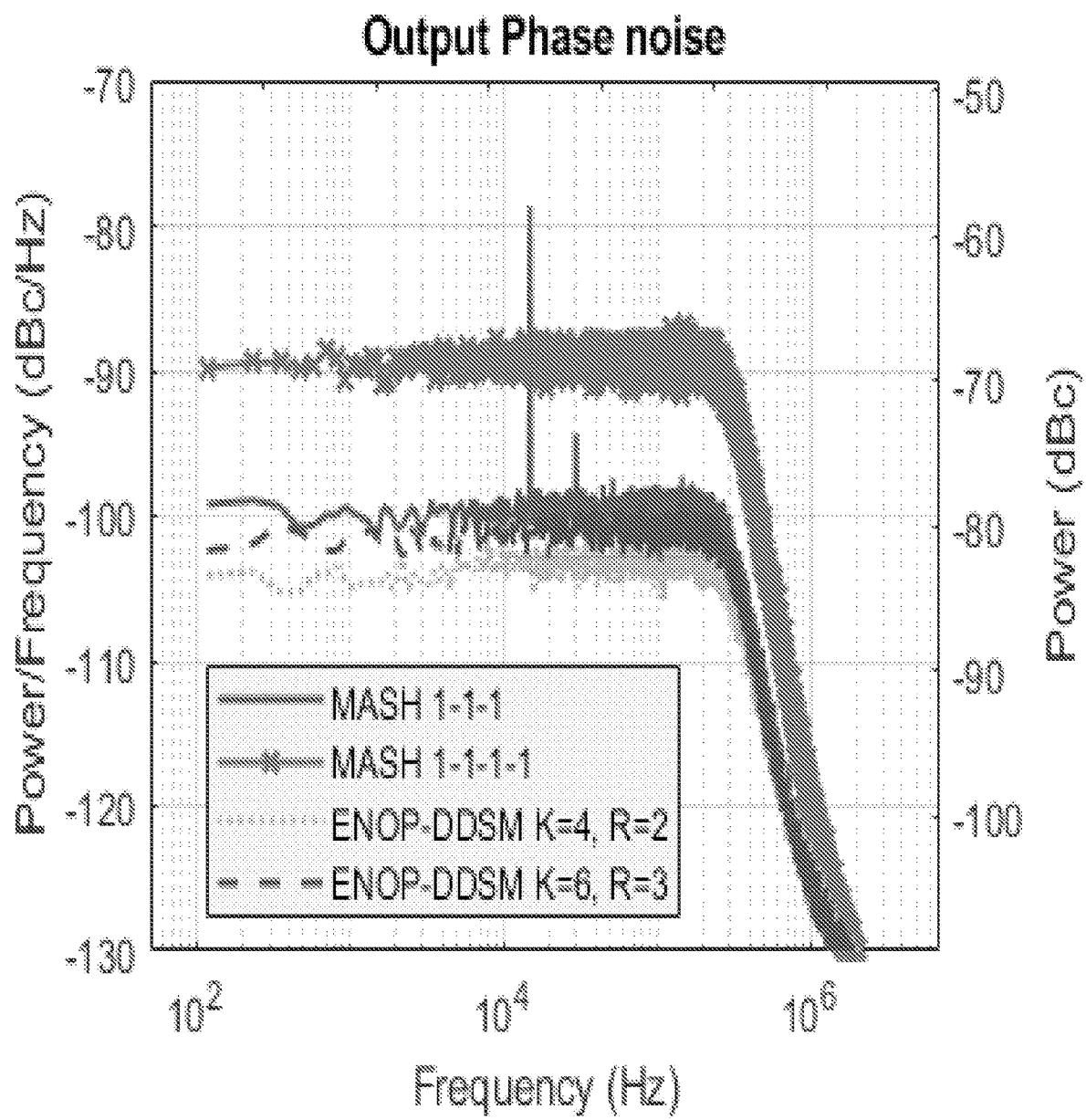
FIG. 18 shows simulated spectra of the output phase noise of a fractional-N frequency synthesizer having a third-order polynomial nonlinearity with (a) a MASH 1-1-1 divider controller, (b) a MASH 1-1-1-1 divider controller, (c) the cascaded ENOP-DDSM with K=4, R=2 shown in FIG. 15 and (d) the nested cascaded ENOP-DDSM with K=6, R=3 shown in FIG. 17.

FIG. 18 shows a comparison of output phase noise spectra of a synthesizer with a third-order polynomial nonlinearity and four different divider controllers: (a) the MASH 1-1-1 of FIG. 6, (b) the MASH 1-1-1-1 of FIG. 10, (c) the cascaded ENOP-DDSM with K=4, R=2 shown in FIG. 15 and (d) the nested cascaded ENOP-DDSM with K=6, R=3 shown in FIG. 17.

In FIG. 18, x=127 and M=$2^{20}$, and the third-order polynomial nonlinearity in the synthesizer is $$\mathcal{N}_{(x)} = x + 0.02x^2 + 0.01x^3.$$

The spurs and folded noise caused by interaction between the output y of the divider controller and the nonlinearity $\mathcal{N}(\cdot)$ in the loop can be minimized by choosing $NTF_A(z)$ and $NTF_B(z)$ as described.

By comparison with the MASH 1-1-1 and MASH 1-1-1-1 divider controllers, it can be seen from FIG. 18 that the use of ENOP-DDSMs results in the elimination of spurs and a lower folded noise floor in the phase noise spectrogram of the output signal.

Figure 19:
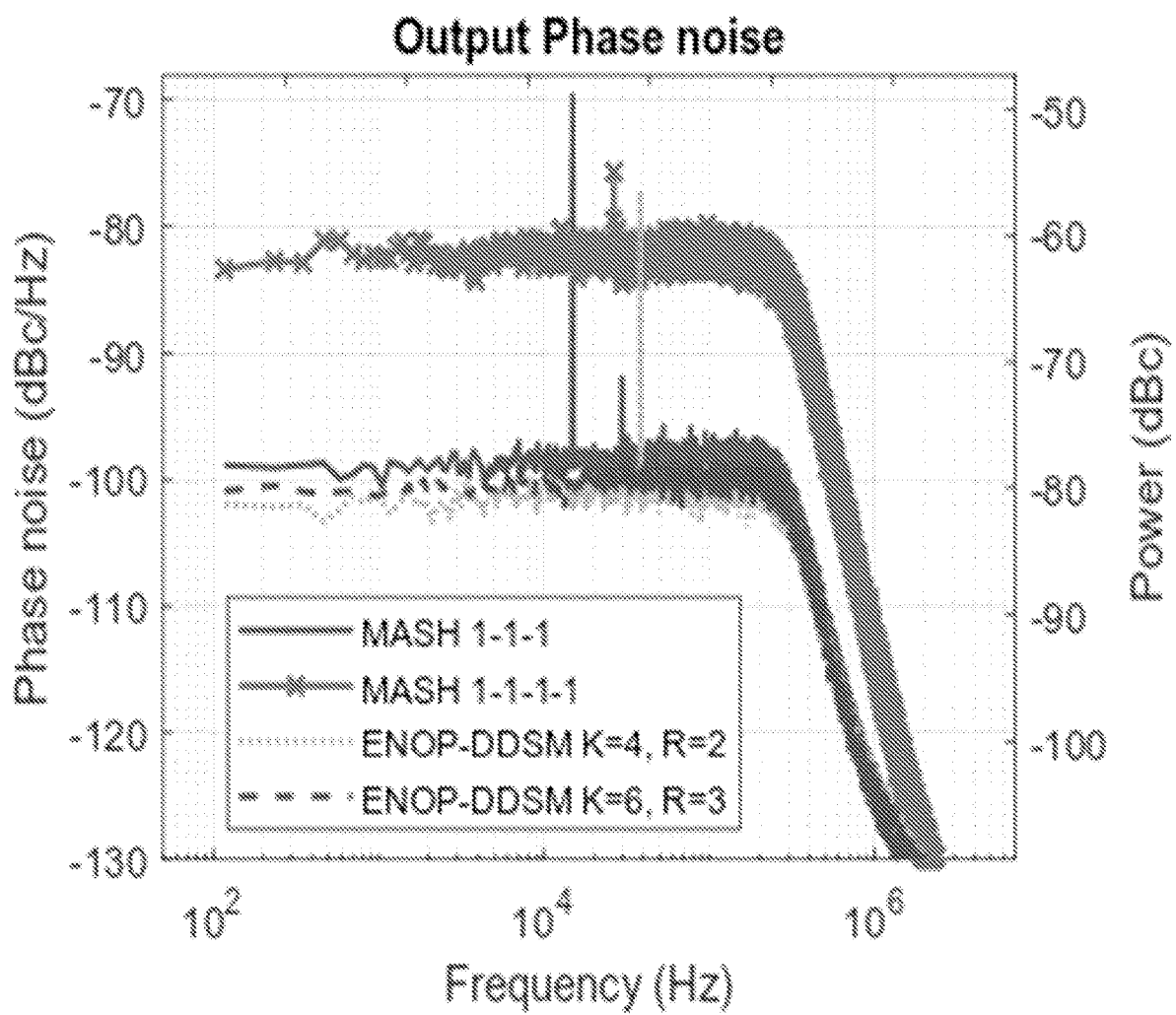
FIG. 19 shows simulated spectra of the output phase noise of a fractional-N frequency synthesizer having a fifth-order polynomial nonlinearity with (a) a MASH 1-1-1-1 divider controller, (b) a MASH 1-1-1 divider controller, (c) the cascaded ENOP-DDSM with K=4, R=2 shown in FIG. 15 and (d) the nested cascaded ENOP-DDSM with K=6, R=3 shown in FIG. 17.

FIG. 19 shows simulated spectrograms of the output phase noise of a fractional-N frequency synthesizer with three different divider controllers: (a) the MASH 1-1-1 of FIG. 6, (b) the MASH 1-1-1-1 of FIG. 10, (c) the cascaded ENOP-DDSM with K=4, R=2 shown in FIG. 15 and (d) the nested cascaded ENOP-DDSM with K=6, R=3 shown in FIG. 17.

In each case, the memoryless nonlinearity is a fifth-order polynomial $$\mathcal{N}_{(x)} = x + 0.042x^2 + 0.031x^3 - 0.01x^4 - 0.005x^5$$

Furthermore, M=$2^{20}$ and x=127,227,327 and 427 for the MASH 1-1-1, MASH 1-1-1-1, cascaded ENOP-DDSM and nested cascaded ENOP-DDSMs, respectively.

It can be seen from FIG. 19 that the use of the noise transfer function $NTF(z) = M^{-1}(1-z^{-1})^2(1+z^{-2}-z^{-4}-z^{-5})$ results in the elimination of spurs and a low folded noise floor in the phase noise spectrogram of the output signal.

When incorporated in a fractional-N frequency synthesizer with pth order polynomial distortion, the low spur and noise divider controller of the present disclosure with noise transfer function $NTF(z) = M^{-1}(1-z^{-1})(1+\Sigma_{i=1}^{K} c_i z^{-i})$ which satisfies the conditions described above and with a given R does not exhibit spurs if $$R \geq \frac{p+1}{2}.$$

Furthermore, the folded noise introduced by the low spur and noise divider controller is minimized.

Accordingly, the use of a DDSM based divider controller having the above described noise transfer function results in the generation of a signal that is characterised by an improved spur immunity performance when distorted by static polynomial nonlinearities. Thus, it will be appreciated that the divider controller of the present disclosure, when used with a fractional-N frequency synthesizer, provides a signal which is less prone to produce spurs and folded noise than a frequency synthesizer which uses a conventional dithered digital delta-sigma modulator. Through the minimization of nonlinearity-induced folded noise and the mitigation of spurs, it enables the frequency synthesizer to generate cleaner carriers for a range of applications including communications, radar and instrumentation.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The present disclosure is not limited to the embodiments hereinbefore described but may be varied in both construction and detail

The invention claimed is:

1. A fractional-N PLL device, comprising:
a voltage controlled oscillator;
a phase-locked loop comprising a multimodulus divider, wherein the phase-locked loop generates an output frequency from the controlled oscillator; and
a digital delta-sigma modulator (DDSM) configured to provide a sequence of integers to control the multimodulus divider to settle to a desired fraction,
wherein the DDSM is configured to generate an output signal y[n] responsive to an input signal x[n], a quantization error signal e[n] and a dither signal d[n] in accordance with an equation defined in the z domain as:

$Y(z) = STF(z)X(z) + DTF(z)D(z) - NTF(z)E(z)$, wherein Y(z), X(z), D(z) and E(z) are z-transforms of the output signal, the input signal, the dither signal, and the quantization error signal, and
wherein STF(z), DTF(z) and NTF(z) correspond to a transfer function of the input signal, a transfer function of the dither signal, and a transfer function of the quantization error signal, and wherein the transfer function of the quantization error signal is of the form:

$$NTF(z) = Az^{-Q}(1-z^{-1})\left(1 + \sum_{i=1}^{K} c_i z^{-i}\right)$$

where A, Q and K are constants, coefficients $c_i$ are real valued and $c_K \neq 0$ and wherein at least one of the zeroes $z_j$ of $$\left(1 + \sum_{i=1}^{K} c_i z^{-i}\right)$$

satisfies $z_j \neq +1$ for j=1, 2, . . . , K.

2. The fractional-N PLL device of claim 1, wherein the coefficients $c_i$ are equal to −1, 0 or 1.

3. The fractional-N PLL device of claim 1, wherein R of the coefficients $c_i$ are equal to −1, (R−1) of the coefficients $c_i$ are equal to +1 and the other (K−2R+1) of the coefficients $c_i$ are equal to zero, with $$R \leq \frac{K+1}{2}.$$

4. The fractional-N PLL device of claim 1, wherein the z-domain equation is implemented with a multi-bit single-quantizer DDSM architecture.

5. The fractional-N PLL device of claim 1, wherein the z-domain equation is implemented with a multistage noise shaping cascaded DDSM architecture comprising an error cancellation network and L≥2 error feedback modulator (EFM) stages, wherein an error output $e_j$ of stage j is applied as an input to stage (j+1) and wherein outputs $y_j$ of the L stages are combined in the error cancellation network to provide the output y.

6. The fractional-N PLL device of claim 5, wherein the L Error Feedback Modulator (EFM) stages comprise a first portion and a second portion, wherein the first portion comprises (L−1) error feedback modulator stages and the second portion comprises the Lth error feedback modulator stage, wherein the first portion and the error cancellation network implement the noise transfer function $NTF_A(z) = A_A z^{-Q_A}(1-z^{-1})^S$ wherein $A_A$, $Q_A$ are constants and S is equal to $\Sigma_{i=1}^{L-1} s_i$, where $s_i$ is the order of the $EFM_i$ wherein the noise transfer function $NTF_i(z) = A_i z^{-Q_i}(1-z^{-1})^{s_i}$ where $A_i$ and $Q_i$ are constants with $i=1, 2, \ldots L-1$, and wherein the second portion implements the noise transfer function $$NTF_B(z) = A_8 z^{-Q_B}(1-z^{-1})^{(1-S)}\left(1 + \sum_{i=1}^{K} c_i z^{-i}\right)$$

wherein $A_B$, $Q_B$ are constants.

7. The fractional-N PLL device of claim 5, wherein the L Error Feedback Modulator (EFM) stages comprise a first portion and a second portion, wherein the first portion comprises (L−1) error feedback modulator stages and the second portion comprises the Lth error feedback modulator stage, wherein the first portion and the error cancellation network implement the noise transfer function $$NTF_A(z) = \frac{(1-z^{-1})^{(S)}}{M}$$

wherein S is equal to $\Sigma_{i=1}^{L-1} s_i$, where $s_i$ is the order of the $EFM_i$ wherein the noise transfer function $NTF_i(z) = M^{-1}(1-z^{-1})^{s_i}$ with $i=1, 2, \ldots L-1$, and wherein the second portion implements the noise transfer function $$NTF_B(z) = \frac{(1-z^{-1})^{(1-S)}}{M}\left(1 + \sum_{i=1}^{K} c_i z^{-i}\right).$$

8. The fractional-N PLL device of claim 5, wherein L=3.

9. The fractional-N PLL device of claim 1, wherein the z-domain equation is implemented with an error cancellation network and a nested cascaded structure comprising a plurality of error feedback modulator (EFM) stages connected in a plurality of levels.

10. The fractional-N PLL device of claim 9, wherein the nested cascaded structure comprises T levels of L error feedback modulator (EFM) stages comprising a first portion and a second portion, wherein the first portion comprises (L−1) error feedback modulator stages of each level and the second portion comprises the Lth error feedback modulator stage of each level, wherein the first portion and the error cancellation network implement the noise transfer function $$NTF_A(z) = A_A z^{-Q_A}(1-z^{-1})^S$$

where $A_A$, $Q_A$ are constants and S is equal to $\Sigma_{j=1}^{L-1} s_j$, where $s_j$ is the order of the $EFM_{i,j}$ wherein the noise transfer function $NTF_{i,j}(z) = A_{i,j} z^{-Q_{i,j}}(1-z^{-1})^{s_j}$ where $A_{i,j}$ and $Q_{i,j}$ are constants with $i=1, 2, \ldots T$ and $j=1, 2, \ldots L-1$, and wherein the second portion implements the noise transfer function $$NTF_B(z) = A_8 z^{-Q_B}(1-z^{-1})^{(1-S)}\left(1 + \sum_{i=1}^{K} c_i z^{-i}\right)$$

wherein $A_B$, $Q_B$ are constants.

11. The fractional-N PLL device of claim 9, wherein the nested cascaded structure comprises T levels of L error feedback modulator (EFM) stages comprising a first portion and a second portion, wherein the first portion comprises (L−1) error feedback modulator stages of each level and the second portion comprises the Lth error feedback modulator stage of each level, wherein the first portion and the error cancellation network implement the noise transfer function $$NTF_A(z) = \frac{(1-z^{-1})^{(S)}}{M}$$

where S is equal to $\Sigma_{j=1}^{L-1} s_j$, where $s_j$ is the order of the $EFM_{i,j}$ wherein the noise transfer function $NTF_{i,j}(z) = M_i^{-1}(1-z^{-1})^{s_j}$ with $i=1, 2, \ldots T$ and $j=1, 2, \ldots L-1$, and wherein the second portion implements the noise transfer function $$NTF_B(z) = \frac{(1-z^{-1})^{(1-S)}}{M}\left(1 + \sum_{i=1}^{K} c_i z^{-i}\right).$$

12. The fractional-N PLL device of claim 1, wherein the coefficients $c_i$ are valued such that the noise transfer function can be represented in the form:

$$NTF(z) = A z^{-Q}\left(1 + \sum_{i=1}^{K+1} d_i z^{-i}\right)$$

wherein coefficients $d_i$ are equal to −1, 0 or 1, and $$\sum_{i=1}^{K+1} |d_i| \leq -1 + 2\sum_{i=1}^{K} |c_i|.$$

13. The fractional-N PLL device of claim 12, wherein the coefficients $c_i$ are equal to −1, 0 or 1.

* * * * *